(12) United States Patent
Rentzepis

(10) Patent No.: US 6,608,774 B1
(45) Date of Patent: Aug. 19, 2003

(54) TWO-PHOTON FOUR-DIMENSIONAL OPTICAL MEMORY

(75) Inventor: Peter M. Rentzepis, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 08/453,320

(22) Filed: May 30, 1995

Related U.S. Application Data

(63) Continuation of application No. 08/163,907, filed on Dec. 6, 1993, now abandoned, which is a continuation-in-part of application No. 07/586,456, filed on Sep. 21, 1990, now Pat. No. 5,325,324, which is a continuation-in-part of application No. 07/342,978, filed on Apr. 25, 1989, now Pat. No. 5,268,862.

(51) Int. Cl.[7] .............................. G11C 7/00; G11C 13/04
(52) U.S. Cl. ........................................ 365/127; 365/119
(58) Field of Search ................................ 365/106, 119, 365/127

(56) References Cited

U.S. PATENT DOCUMENTS

| | | | | |
|---|---|---|---|---|
| 3,715,734 A | * | 2/1973 | Fajans | 365/127 |
| 4,466,080 A | * | 8/1984 | Swainson et al. | 365/127 |
| 4,707,787 A | * | 11/1987 | Savit et al. | 365/127 |

* cited by examiner

*Primary Examiner*—Terrell W. Fears
(74) *Attorney, Agent, or Firm*—Fuess & Davidenas

(57) ABSTRACT

Selected domains, normally $2 \times 10^3 \times 2 \times 10^3$ such domains arrayed in a plane, within a three-dimensional (3-D) volume of radiation-sensitive medium, typically 1 cm$^3$ of spirobenzopyran containing $2 \times 10^3$ such planes, are temporally and spatially simultaneously illuminated by two radiation pulses, normally laser light pulses in various combinations of wavelengths 532 nm and 1024 nm, in order, dependent upon the particular combination of illuminating light, to either write binary data to, or read binary data from, the selected domains by process of two-photon (2-P) interaction/absorption. One laser light pulse is preferably directed to illuminate all domains during its propagation along one directional axis of the volume. The other laser light pulse is first spatially encoded with binary information by 2-D spatial light modulator, and is then (i) directed and (ii) time sequenced to intersection with the other light pulse in a locus of intersection domains. During writing the selected, simultaneously illuminated, intersection domains change their index of refraction, attendant upon a change in isomeric molecular form, by process of 2-P absorption. During reading selected intersection domains selectively refract each of two read light pulses identically—as well as fluoresce—dependent upon their individually pre-established, written, states. The selective refraction of each read pulse in its passage straight through the volume is sensed in a detector array. I/O bandwidth to each cm$^3$ of radiation-sensitive medium is on the order of 1 Gbit/sec to 1 Tbit/sec.

21 Claims, 11 Drawing Sheets

US 6,608,774 B1

TWO-PHOTON FOUR-DIMENSIONAL OPTICAL MEMORY

REFERENCE TO RELATED PATENT APPLICATIONS

The present application is a continuation of application Ser. No. 08/163,907 filed on Dec. 6, 1993, now abandoned. That previous application was itself a continuation-in-part of application Ser. No. 586,456 filed Sep. 21, 1990 for a THREE-DIMENSIONAL OPTICAL MEMORY to joint inventors including the same inventor Peter M. Rentzepis who the sole inventor in the present application, which application issued Jun. 28, 1994 as U.S. Pat. No. 5,325,324. That application Ser. No. 586,456 is itself a continuation-in-part of the application Ser. No. 342,978 filed Apr. 25, 1989—issued Dec. 7, 1993 as U.S. Pat. No. 5,268,862—for a THREE-DIMENSIONAL OPTICAL MEMORY to the selfsame inventor Peter M. Rentzepis. Both predecessor applications are assigned to the same assignee as is the present application: The Regents of the University of California.

RIGHTS IN THE U.S. GOVERNMENT

The present invention was developed under contract No. DOD F30602-90-C-0014 between the United States Air Force (USAF), acting through its Rome Air Development Center (RADC), through Call/Recall Corporation, and through the Regents of the University of California. The U.S. Government has a paid-up license in this invention and the right in limited circumstances to require the patent owner to license others on reasonable terms as provided for by the terms of the above-stated contract awarded by USAF, RADC.

BACKGROUND OF THE INVENTION

1. Field of the Invention

The present invention generally concerns three-dimensional optical memory apparatus and memory media, and methods of using such apparatus and media. The present invention particularly concerns (i) three-dimensional volumes of an active, radiation-sensitive, medium that is selectively both alterable and interrogatable by use of at least two intersecting beams of radiation, thereby to form a radiation memory; (ii) the manner of using the intersecting radiation beams and the physical and/or chemical effects of such use; (iii) the construction of binary-stated informational memory stores, three-dimensional patterns, and/or three-dimensional displays based on these effects; (iv) the manner of selectively directing radiation beams to intersect within three-dimensional volumes for purposes of addressing selected domains within such volumes, particularly to serve as an addressable memory store; and (v) the manner of selectively impressing information on, or extracting information from, one or more intersecting beams of radiation in order that such information may be radiatively written to, or radiatively read from, a three-dimensional volume memory.

2. Background of the Invention

2.1 The General Requirement for Information Storage in Memories

The need for computerized data storage and processing has been increasing, in the past decade, at a high rate. In response to this need, semiconductor-based computer technology and architecture have greatly improved. However, barriers to further reducing the size and price of semiconductors may now be inhibiting development of even higher performance computers, and the more widespread use of high performance computers.

The major determinant of the size and price of high performance computers is the memory. The data storage requirements of new high performance computers, circa 1994, are very great, typically many gigabytes ($10^{12}$ bits). New and improved, compact, low cost, very high capacity memory devices are needed. These memory devices should be able to store many, many gigabytes of information, and would desirably randomly retrieve such information at the very fast random access speeds demanded by parallel computing.

An optical memory offers the possibility of packing binary-stated information into a storage medium at very high density, with each binary bit occupying a space only about one light wavelength in diameter. When practical limitations are taken into account this leads to a total capacity of about $10^{11}$ bits for a reasonably-sized two-dimensional optical storage medium—the amount of information contained in about 3000 normal size books. A comparison of the optical memory to existing types of computer memories is contained in the following Table 1.

TABLE 1

| MEMORY TYPE | CAPACITY | ACCESS TIME | COST |
|---|---|---|---|
| TAPE | $10^{10}$ bits | 100 sec | $10^{-5}$ ¢/bit |
| DISK | $10^{8}$ bits | 300 msec | $5 \times 10^{-2}$ ¢/bit |
| DRUM | $10^{7}$–$10^{8}$ bits | 10 msec | $10^{-2}$ ¢/bit |
| CORE | $10^{6}$ bits | 1 μsec | 2 ¢/bit |
| SEMI-CONDUCTOR | $10^{5}$ bits | 100 nsec | 20 ¢/bit |
| OPTICAL | $10^{9}$–$10^{12}$ bits | 10 nsec | $10^{-3}$–$10^{-4}$ ¢/bit |

The present invention will be seen to be embodied in an optical memory system. Any optical memory system, whether three-dimensional (3-D), four-dimensional (4-D), or otherwise, is based on light-induced changes in the optical, chemical and/or physical properties of materials.

2.2 Optical Recording Media, and the Use Thereof in Optical Memories

At the present two general types of optical recording media exist, namely phase recording media and amplitude recording media. Recording on the media of the first type is based on light-induced changes of the index of refraction (i.e., phase holograms). Recording on the media of the second type is based on photo-induced changes in the absorption coefficient (i.e., hole burning).

Volume information storage is a particularly attractive concept. In a two dimensional memory the theoretical storage density (proportional to 1/wavelength $\lambda^2$) is $1 \times 10^{11}$ bits/cm$^2$ for $\lambda = 266$ nm. However in a 3-D memory the theoretical storage density is $5 \times 10^{16}$ bits/cm$^3$. Thus the advantages of 3-D data storage versus previous two dimensional information storage media become apparent.

Volume information storage has previously been implemented by holographic recording in phase recording media. Reference F. S. Chen, J. T. LaMacchia and D. B. Fraser, *Appl. Phys. Lett.*, 13, 223 (1968); T. K. Gaylord, *Optical Spectra*, 6, 25 (1972); and L. d'Auria, J. P. Huignard, C. Slezak and E. Spitz, *Appl. Opt.*, 13, 808 (1974).

The present invention will be seen to implement volume writable-readable-erasable optical storage in a phase recording medium that is also, coincidentally, an amplitude recording medium. One early patent dealing with three-dimensional amplitude-recording optical storage is U.S. Ser. No. 3,508,208 for an OPTICAL ORGANIC MEMORY DEVICE to Duguay and Rentzepis, said Rentzepis being the selfsame inventor of the present invention. Duguay and Rentzepis disclose an optical memory device including a two-photon fluorescent medium which has been solidified (e.g., frozen or dispersed in a stable matrix, normally a polymer). Information is written into a selected region of the medium when a pair of picosecond pulses are made to be both (i) temporally coincident and (ii) spatially overlapping within the selected region. The temporally-coincident spatially-overlapping pulses create, by process of two-photon absorption, organic free radicals which store the information at an energy level intermediate between a fluorescent energy level and a ground state energy level. The free radicals store the desired information for but a short time, and until they recombine. The information may be read out by interrogating the medium with a second pair of coincident and overlapping picosecond pulses. In the case where the medium is frozen solid, interrogation may also be accomplished by directing a collimated infrared light beam into the selected region, thereby causing that region to liquefy and permitting its contained free radicals to undergo recombination. In each of the aforementioned cases, the interrogation beam causes the interrogated region to selectively fluoresce in accordance with the presence, or absence, or free radicals. The emitted radiation is sensed by an appropriate light detector as an indication of the informational contents of the interrogated region.

This early optical memory of Duguay and Rentzepis recognizes only that two-photon absorption should be used to produce excited states (e.g., singlet, doublet or triplet states) of an radiation-sensitive medium over the ground state of such medium. These excited states are metastable. For example, one preferred fluorescent medium is excitable from ground to a singlet state by process of two-photon absorption occurring in about $10^{-15}$ second. The excited medium will remain in the singlet state for about $10^{-8}$ second before fluorescing and assuming a metastable triplet state. This metastable state represents information storage. Alas, this metastable state will spontaneously decay to the ground state by fluorescence after about 1 second (depending on temperature). The memory is thus unstable to hold information for periods longer than about 1 second. It should be understood that the fluorescent medium of the Duguay and Rentzepis memory is at all times the identical molecular material, and simply assumes various excited energy states in response to irradiation.

Another previous optical system for accomplishing the volume storage of information, and for other purposes, is described in the related series of U.S. Pat. Nos. 4,078,229; 4,288,861; 4,333,165; 4,466,080; and 4,471,470 to Swainson, et al. and assigned to Formigraphic Engine Corporation. The Swainson, et al. patents are variously concerned with three-dimensional systems and media for optically producing three-dimensional inhomogeneity patterns. The optically-produced 3-D inhomogeneity patterns may exhibit (i) controlled refractive index distributions, (ii) complex patterns and shapes, or (iii) physio-chemical inhomogeneities for storing data. The Swainson, et al. patents generally show that some sort of chemical reaction between two or more reactive components may be radiatively induced at selected cell sites of a 3-D medium in order to produce a somewhat stable, changed, state at these selected sites.

U.S. Pat. No. 4,471,470, in particular, describes a METHOD AND MEDIA FOR ACCESSING DATA IN THREE-DIMENSIONS. Two intersecting beams of radiation are each matched to a selected optical property or properties of the active media. In one embodiment of the method and media, called by Swainson, et al. "Class I systems," two radiation beams generate an active region in the medium by simultaneous illumination. In order to do so, two different light-reactive chemical components are typically incorporated within the medium. Both components are radiation sensitive, but to different spectral regions. The two radiation beams intersecting in a selected region each produce, in parallel, an associated chemical product. When two products are simultaneously present in a selected intersection region then these products chemically react to form a desired sensible object. The sensible object may represent a binary bit of information. One or both of the radiation-induced chemical products desirably undergoes a rapid reverse reaction upon appropriate irradiation in order to avoid interference effects, and in order to permit the three-dimensional media to be repetitively stored.

In other embodiment of the Swainson et al. method and media, called "Class II systems," one of the radiation beams must act on a component of the medium before the medium will thereafter be responsive to the other radiation beam. The class I and class II systems thus differ by being respectively responsive to the effects of simultaneously, and sequentially, induced photoreactions.

The Swainson, et al. patents—including those patents that are not directed to information storage and that are alternatively directed to making optical elements exhibiting inhomogeneity in their refractive index, or to making physical shapes and patterns—are directed to inducing changes in a bulk media by impinging directed beams of electromagnetic radiation, typically laser light, in order that selected sites within the bulk media may undergo a chemical reaction. There are a large number of photosensitive substances that are known to undergo changes in the presence of light radiation. The changed states of these substances are, in many cases, chemically reactive. The patents of Swainson, et al. describe a great number of these photosensitive and photo-reactive substances. Such substances may generally be identified from a search of the literature.

Swainson, et al. also recognize that molecular excitation from a ground state to an excited state may occur following a stepwise absorption of two photons. Swainson, et al. call this "two-photon absorption." Swainson, et al. describe that a solution of 8'allyl-6'nitro-1,3,3-trimethylspiro(2'N-1-benzopyran-2'-2-induline) in benzene may be exposed to intersecting synchronized pulsed ruby laser beams transmitted through an UV elimination filter to form, at the region of intersection, a spot of color. The process of stepwise absorption of two photons in this solution, and in others, is recognized by Swainson, et al., only as regards its use to produce an excited state that may form (as in the example) colored products, or that may serve as an energy transfer agent.

In making all manner of excited states—including singlet, doublet, triplet, and quartet states—the patents of Swainson, et al. describe known photochemistry. Generally chemistry, and photochemistry, that is known to work in one dimension is equally applicable in three dimensions. For example, it is known that an electron may be knocked off an active substance so that it becomes an ion. For example, it is known that radiation may cause a substance to dissociate a proton, again becoming an ion. For example, it is even known how to induce spin changes and changes in parity by electromagnetic radiation. Once these changes, or others, are induced in an radiation-sensitive medium then Swainson, et al. describe a reliance on the transport capabilities of the liquid or gaseous support media in order to permit a chemical reaction to transpire.

The present invention will be seen to reject the Swainson et al. approach of inducing chemical reactions in a 3-D medium by creating one or more reagents by use of radiation. One reason why the present invention does so is because the same support medium, or matrix, that offers those transport capabilities that are absolutely necessary to permit the chemical reactions to occur will also permit, at least over time, undesired migration of reagents or reaction products in three dimensions, destroying the integrity of the inhomogeneity pattern.

2.3 The Related Predecessor Patent Applications

The inventions of both related patent applications contemplate (i) addressing, and (ii) writing data to or reading data from, selected domains within a three-dimensional volume of radiation-sensitive medium by and with two selectively chosen, coincident, radiation beams. The radiation beams are selectively guided to spatial and temporal coincidence so as to cause certain selected domains, and only those certain selected domains, to selectively undergo selected changes by process of two-photon absorption.

The first co-pending patent application—Ser. No. 342,978 filed Apr. 25, 1989 issued Dec. 7, 1993 as U.S. Pat. No. 5,268,862 for a THREE-DIMENSIONAL OPTICAL MEMORY—particularly teaches selectively inducing isomeric changes in the molecular isomeric form of selected regions within a three-dimensional radiation-sensitive medium by the process of two-photon absorption.

The method of the related invention produces a three-dimensional inhomogeneity pattern in a volume of active media in response to directed electromagnetic radiation. In order to do so, an radiation-sensitive medium having at least two isomeric molecular forms is contained within a volume. The radiation-sensitive medium is responsive to energy level changes stimulated by electromagnetic energy to change from one of its isomeric molecular forms to another of its isomeric molecular forms. A selected portion of the radiation-sensitive medium is selectively radiated with plural directed beams of electromagnetic radiation to change the selected portion from the one isomeric molecular form to the other isomeric molecular form by process of plural-photon absorption. The induced isomeric changes possess useful optical, chemical, and/or physical characteristics.

In the preferred embodiment of the first predecessor invention an radiation-sensitive medium, typically a photochromic material and more typically spirobenzopyran, was maintained in a three-dimensional matrix, typically of polymer, and illuminated in selected regions by two UV laser light beams, typically of 532 nm. and 1064 nm. wavelength. The illumination cause the radiation-sensitive, photochromic, spirobenzopyran medium to change from a first, spiropyran, to a second, merocyanine, stable molecular isomeric form by process of two-photon absorption. Regions not temporally and spatially simultaneously illuminated were unchanged. Later illumination of the selected regions by two green-red laser light beams, typically of 1064 nm wavelength each, caused only the second, merocyanine, isomeric form to fluoresce. This fluorescence was detectable by photodetectors as stored binary data. The three-dimensional memory can be erased by heat, or by infrared radiation, typically 2.12 microns wavelength. Use of other medium permit the three-dimensional patterning of three-dimensional forms, such as polystyrene polymer solids patterned from liquid styrene monomer. Three-dimensional displays, or other inhomogeneity patterns, can also be created.

The present application will be seen to use, as one suitable radiation-sensitive, photochromic, medium the exact same medium as did the volume optical memory of the predecessor invention: spirobenzopyran. However, the present invention will be seen to make use of a property other than fluorescence that also varies between the two sable isomeric molecular forms of the spirobenzopyran molecule. This property is the index of refraction.

Meanwhile, the second co-pending patent application— Ser. No. 586,456 filed Sep. 21, 1990 for a THREE-DIMENSIONAL OPTICAL MEMORY—particularly deals with a system and method for addressing a three-dimensional radiation memory with two radiation beams so as to, at separate times, write binary data to, and to read binary, data from, such memory by process of two-photon absorption. The radiation beams are typically, but not necessarily, light, and are more typically laser light. Accordingly, the complete device, or system, incorporating such a volume memory was called a two-photon 3-D optical memory, or a 2-P 3-D OM.

The addressing of the volume memory within the 2-P 3-D OM preferably (but not necessarily) used, as a part of one component (a holographic dynamic focusing lens, or HDFL), a hologram. Thus the 2-P 3-D OM was preferably holographically addressed.

The optical memory of the present invention will be seen to dispense with the requirement for a HDFL, or for holographic addressing.

In the 2-P 3-D OM of the second predecessor invention one directed beam of electromagnetic radiation was spatially encoded as an n×n wavefront array of binary bits by use of a two-dimensional spatial light modulator (2-D SLM). This spatially-encoded beam, and an additional, orthogonal, beam of electromagnetic radiation, were then selectively guided into spatial and temporal coincidence at a selected n×n planar array of domains within a three-dimensional matrix of such domains within a three-dimensional volume of radiation-sensitive medium.

This function of the optical memory of the second predecessor invention to spatially encode information upon a planar wavefront, or pulse, of radiation will be seen to be continued in the optical memory of the present invention.

In the second predecessor invention, the spatially-encoded selectively-guided coincident radiation beams served, dependent upon their combined energies, to either write (change) or read (interrogate) the condition, and particularly the isomeric molecular form, of the selected domains by a process of two-photon absorption. Remaining, unselected, domains received insufficient (i) intensity from either beam, or (ii) combined energy from both beams, so as to be substantially affected.

This function, and property, will also be seen to be preserved in the optical memory of the present invention.

In its preferred embodiment, the optical memory of the second predecessor invention served to temporally and spatially simultaneously illuminate by two radiation beams—normally laser light beams in various combinations of wavelengths 532 nm and 1024 nm—certain selected domains—normally $10^3 \times 10^3$ such domains arrayed in a plane—within a three-dimensional (3-D) volume of radiation-sensitive medium—typically 1 cm$^3$ of spirobenzopyran containing $10^2$ such planes. The selective illumination served, dependent upon the particular combination of illuminating light, to either write binary data to, or read binary data from, the selected domains by process of two-photon (2-P) absorption. One laser light beam was preferably directed to illuminate all domains of the selected plane in and by a one-dimensional spatial light modular (1-D SLM). The other laser light beam was first spatially encoded with binary information by 2-D SLM, and was then also directed to illuminate the domains of the selected plane. Direction of the binary-amplitude-encoded spatially-encoded light beam was preferably by focusing, preferably in and by a holographic dynamic focusing lens (HDFL). During writing the selected, simultaneously illuminated, domains changed in their isomeric molecular form by process of 2-P absorption. During reading the selected domains fluoresced dependent upon their individually pre-established, written, states. The domains' fluorescence was focused by the HDFL, and by other optical elements including a polarizer and polarizing beam splitter, to a $10^3 \times 10^3$ detector array. The I/O bandwidth to each $cm^3$ of radiation-sensitive medium was on the order of 1 Gbit/sec to 1 Tbit/sec.

2.4 Spatial Light Modulators

The three-dimensional optical memory of the present invention will be seen to employ spatial light modulators, as did the optical memories of the related predecessor inventions.

A recent survey, circa 1990, of spatial light modulators is contained in the article *Two-Dimensional Spatial Light Modulators: A Tutorial* by John A. Neff, Ravindra A. Athale, and Sing H. Lee, appearing in Proceedings of the IEEE Vol. 78, No. 5, May 1990 at page 826. The following summary is substantially derived from that article.

Two-dimensional Spatial Light Modulators (SLMs) are devices that can modulate the properties of an optical wavefront—such as the properties of amplitude, phase, or polarization—as a function of (i) two spatial dimensions and (ii) time in response to information-bearing control signals that are either optical or electrical. SLMs usefully form a critical part of optical information processing systems by serving as input transducers as well as performing several basic processing operations on optical wave fronts.

SLMs, although once considered simply as transducers that permitted the input of information to an optical processor, have a broad range of applications, and are capable of performing a number of useful operations on signals in the optical domain. Some of the more important functions that have been demonstrated with SLMs are: analog multiplication and addition, signal conversion (power amplification, wavelength, serial-to-parallel, incoherent-to-incoherent, electrical-to-optical), nonlinear operations, and short-term storage.

The functional capabilities of SLMs can be exploited in a wide variety of optical computer architectures. Applications of 1-D and 2-D SLMs encompass just about every optical signal processing/ computing architecture conceived.

SLMs may be classified as to type. The major classification categories result from (i) the optical modulation mechanism, (ii) the variable of the optical beam that is modulated, (iii) the addressing mode (electrical or optical), (iv) the detection mechanism (for optically-addressed SLMs), and (v) the addressing mechanism (for electrically-addressed SLMs).

The modulation of at least one property of a readout light beam is inherent in the definition of an SLM. Hence the first major category of SLMs is based on modulation mechanisms. The modulation mechanism employs an intermediate representation of information within a modulating material. An information-bearing signal, either optical or electrical, is converted into this intermediate form. The major forms of conversion mechanisms that are employed in 2-D SLMs are (a) Mechanical
(b) Magnetic
(c) Electrical
(d) Thermal.

Of these conversion mechanisms, the electrical mechanism will be seen to be preferred for use in the three-dimensional optical memory of the present invention. In the electrical conversion mechanism, the electric field interacts with the modulating material at several levels, giving rise to different effects. The interaction can take the form of distorting the crystal lattice, changing the molecular orientations, or modulating the electron density functions.

A conversion mechanism and the modulating material so converted have a characteristic response time, activation energy, and spatial scale. These parameters, in turn, have a major impact on the respective speed sensitivity and spatial resolution of the optical modulation performed by the SLM. A modulation mechanism, however, becomes physically more specific only when combined with a choice of appropriate modulation variables, to be discussed next.

An optical wavefront has several associated variables that can be modulated as a function of the spatial coordinates and time in order to carry information. These variables include (a) Intensity (amplitude)
(b) Phase
(c) Polarization
(d) Spatial frequency spectrum (texture).

Intensity (amplitude) and phase are the most commonly used representations in an optical computing system. Polarization and spatial frequency spectrum are often used as intermediate representations, and are converted into intensity or phase modulation before the information is used in the next stage of the optical computing system. Intensity (amplitude), phase, and polarization modulation will each be seen to be employed in the three-dimensional optical memory of the present invention.

Intensity, or amplitude, modulation commonly results when the absorption characteristics of a modulating material are changed. Because the intensity of a light beam is proportional to the square of its amplitude, the difference between these two modes depends on the variable that is employed in subsequent processing of a SLM output. The present invention will be seen to be more concerned with selectively controllably spatially modulating to zero intensity, and amplitude, then with any requirement that modulation at and to an opposite binary state should produce sufficient intensity, and amplitude, so as to permit a desired operation within an optical memory. This is because any presence of light intensity, or amplitude, in those spatial locations of an optical wavefront (i.e., at a particular time) where, and when, there is desirably no light intensity, nor any amplitude, constitutes optical noise.

The three-dimensional optical memory in accordance with the present invention will be seen to be innately highly insensitive to optical noise, being roughly sensitive to $(noise/signal)^2$, as opposed to the lesser figure of merit noise/signal, in certain operations. Nonetheless to this innate insensitivity, optical noise may be cumulative in degrading the integrity of informational stores within the optical memory over billions and trillions of read and write cycles.

Accordingly, intensity, or amplitude, modulation in accordance with the present invention is desirably very "clean," with minimal, essentially zero, optical intensity or amplitude in those wavefront regions which are spatially modulated to one ("0") binary state. Spatial light modulation, and SLMs, will be seen to so operate in the present invention: veritably no light will be in regions where it is not wanted.

Polarization modulation is commonly achieved by modulating the birefringence associated with the modulating material of the SLM. Birefringence is a property of some materials in which the refractive index depends on the state of polarization and direction of light propagation. Depending upon the effect utilized, the state of polarization changes (e.g., from linear to elliptical), or the angle of the linear polarization changes without changing the state of polarization. The memory system of the present invention will be seen to use phase-modulating SLMs that produce each such effect.

Polarization modulation can be changed into intensity (amplitude) modulation by employing polarized readout light and an analyzer in the output. The memory system of the present invention will later be seen to be so change polarization modulation into intensity modulation. Indeed, this will be seen to be a primary approach by which the net effective intensity, or amplitude, modulation will be rendered exceptionally "clean," and of satisfactory quality to support reliable operation of the three-dimensional optical memory over great periods of time and astronomical numbers of read and write cycles.

2.5 The Figure of Merit of a Readable and Writable and Erasable Optical Memory Most new memory technologies are typically immediately gauged by the figures of merit that have attended past technologies. These previous figures of merit, while generally representing criteria that must be met by an operational memory, are often substantially irrelevant to the truly critical performance aspects, and new figures of merit, appropriate to a new technology.

For example, the Intellectual Property Owners, Inc. gives annual awards in the name of its educational subsidiary the IPO Foundation to distinguished inventors. In the 1989 awards, Robert P. Freese, Richard N. Gardner, Leslie H. Johnson and Thomas A. Rinehart were honored for their improvements in erasable, re-writable optical disks introduced by the 3M Company during 1988. The optical disks can store 1,000 times as much information as conventional flexible diskettes used with personal computers. The inventors were the first to achieve a signal to noise ratio for an erasable optical disk in excess of 50 decibels.

Although the inventors of the present invention would be the first to recognize this contribution, and to acknowledge the necessity of an adequate optical (and electrical) signal-to-noise ratio for optical memories, a focus on signal-to-noise as a figure of merit may be rooted in the importance of this measurement in certain previous electrotechnology. For example, certain magnetic memories, such as garnet film and Block line memories, have undesirably small signal-to-noise ratios.

It is uncertain what constitutes the ultimate, or even the most appropriate, figure of merit (or figures of merit) for a readable and writable and erasable optical memory. However, it is suggested that, in the case of a three-dimensional optical memory, it is important to consider whether or not, and how fast, the memory might become "dirty" from use and suffer degradation in the integrity of its data stores.

The concept of a "dirty" three-dimensional optical memory arises because every read and write operation on the memory by use of radiation has the potential to perturb other storage domains than just those domains that are intended to be dealt with. The most analogous prior memory technology may be the original square loop ferrite magnetic core memories. In these early core memories many millions of interrogations of one memory location may cause a single magnetized core having a weak hysteresis to fail to provide a sense signal adequate for detection of its magnetic condition, meaning the binary data bit stored. Even more relevantly, unaddressed and/or unwritten cores, commonly in physically proximate positions, may sometimes inadvertently and erroneously change hysteresis state, causing attendant loss of data.

A three-dimensional optical memory is analogous. The radiation that is used to read and write selective domains of the memory can, if great care is not employed, end up, after millions or billions of cumulative cycles, changing domains other than those domains that are desired to be changed. Such an undesired change of domains degrades the integrity of the data stored within the memory.

Accordingly, the present invention concerns not only addressably reading and writing and erasing a three-dimensional optical memory and doing so at impressive levels of performance, but doing so by design, at a high figure of merit. A "high figure of merit" means that an optical memory constructed in accordance with the invention is practically and reliably useful in the real world, reliably storing and reading any and all data patterns with absolute integrity during indefinitely long periods of any pattern of use, or non-use, whatsoever. Consider that three-dimensional optical memories, storing information in a volume that is little more than a cube of plastic, are intrinsically physically amorphous and homogenous. It is prudent to use some care, and forethought, in the manner of radiative reading and writing of such a volume so that those changes that are selectively induced within selected domains of the volume should be absolutely stable and independent. Nothing should be done, or repetitively done, on any selected domains that adversely affects the integrity of non-selected domains.

SUMMARY OF THE INVENTION

The present invention contemplates a random-access non-destructive-readout "four dimensional" ("4-D") radiation memory that is selectively repetitively addressably writable and non-destructively readable (and, less commonly, erasable) by process of two-photon ("2-P") interaction.

In various preferred embodiments of the invention a three-dimensional volume of radiation-sensitive medium, typically a photochromic material and more typically spirobenzopyran, maintained in a matrix, typically a 1 $cm^3$ cubical polymer matrix, is selectively written by two selectively controllably time-phased UV laser light pulses, typically two 10 picosecond pulses of 532 nm and 1064 nm wavelength. One of the radiation pulses is two-dimensionally spatially encoded in its wavefront. The two radiation pulses are (i) spatially directed, including so as to counter-propagate at 180° opposition to each other, and (ii) temporally phase-sequenced, so as to temporally and spatially intersect, satisfying the quantum mechanical equations of two-photon interaction, within only a portion of the volume, typically a plane of $(2 \times 10^3)^2$ arrayed domains.

During writing, both illuminating write radiation pulses pass substantially unobstructed straight through the volume of the radiation-sensitive medium, temporally and spatially simultaneously intersecting inside this volume substantially only in a defined locus of intersection domains. The index of refraction of these intersection domains is selectively changed by process of two-photon absorption. Other domains not temporally and spatially simultaneously illuminated are totally unchanged.

During subsequent reading, two green-red laser light beams, typically of 1064 nm wavelength each, pass substantially unobstructed through the same volume, each interacting with the index (indices) of refraction thereof substantially only by two-photon interaction and substantially only in a locus of intersection domains. The interaction of each green-red laser light beam in, and substantially only in, the precisely-defined intersection domains is detectable by redundant arrayed photodetectors as binary data stored in the intersection domains.

During reading with the two green-red laser light beams the medium at each intersection domain also selectively fluoresces dependent upon its pre-existing index of refraction—which index of refraction is, in the preferred spirobenzopyran radiation-sensitive medium, also indicative of the isomeric molecular form of the medium. This fluorescence, occurring at a separate wavelength and frequency from each of the selectively transmitted read light pulses, is also detectable as the binary data stored in the intersection domains. Each frequency of light output being a separate dimension, the two-photon ("2-P") radiation memory is four dimensional, or "4-P".

1. Principles of Operation of the 2-P 4-D Radiation Memory

A 2-P 4-D radiation memory in accordance with the present invention stores binary information in a three-dimensional (3-D) volume of a medium that is sensitive to radiation in its absorption band so as to undergo an anomalous, stable, change in its index of refraction. For simplicity, this medium is called a "radiation-sensitive medium". The 3-D volume may be, for example, in the shape of a cube of typical size 1 cm$^3$. The cube may typically contain as a radiation-sensitive medium the photochromic chemical spirobenzopyran stably held in position in and by a matrix of, for example, polymer plastic.

The cubical 3-D volume of radiation sensitive medium is, accordance with the present invention, simultaneously momentarily radiatively illuminated along each of two axis that are mutually intersecting at a predetermined angle. The illumination axis are typically intersecting either at 90,—perpendicularly—or at 180,—in which case the two axis are really but one axis along which the two radiation illuminations are counter-propagating.

The illuminating radiation along at least one, and preferably both, of the intersecting axis is in the form of momentary pulse. The pulse can be in the form of a plane wave, alternatively called a planar wave front. At least one illuminating radiation pulse is commonly in this form, and both pulses are preferably in this form and must be in this form particularly in the counter-propagating intersection geometry.

The momentary, pulse, illumination serves to define and to addressably select, in a manner to be explained, a unique multiplicity of domains—for example 4×10$^4$ such domains—out of a very great multiplicity of such domains—for example out of 8×10$^9$ such domains that are three-dimensionally (3-D) arrayed within the volume. Each selected multiplicity of domains is substantially two-dimensional, meaning that it is but one domain "thick" in the direction of each, and of both, illuminations. The selected multiplicity of domains can be, but need not be, in a plane (irrespective of whether either or both illuminating radiation pulses in a planar wavefront). Note that the domains are defined by the illumination, and do not represent initially, or permanently, physically or otherwise-differentiated regions within the volume of radiation-sensitive medium, which is substantially homogeneous.

Each domain stores binary information as one of two stable states, each of which states has a different associated index of refraction.

Domains within the 3-D volume of radiation-sensitive medium are written (changed from a first to a second state and associated index of refraction) by process of two-photon absorption. Domains are so written upon such times as two time-resolved radiation beams, or radiation pulses, together having a joint energy that aggregates a predetermined first energy level both (i) temporally and (ii) spatially intersect within the domain. (Remember always that the energy of a radiation beam, or radiation pulse, is a function of its frequency (E=hv), and not of either its intensity or its duration.) The radiation-sensitive medium within each intersection domain is responsive to radiation of this first energy level to change from a first one of its two stable states to its other, second, state.

The responsiveness of the radiation-medium to so change is a function of the well-known quantum-mechanical equations of two-photon interaction, particularly (in the case of writing the medium) two-photon absorption. The necessity, in accordance with the law of physics, of having a temporal, as well as a spatial overlap between the two intersecting radiation pulses will prove important to the present invention. Namely, in accordance with the present invention the (i) durations and (ii) time sequence (relative phase) of the illuminating pulses, as well as their spatial directions, will be positively controlled. The size and locations of the domains, as well as the nature of changes in the state and the percentage completeness of such changes within the volume of the domain, is a function of the time (i) duration and (ii) sequence of the illuminating radiation pulses, as well as the direction of such pulses. Indeed, the directions, or axis, of both illuminating radiation pulses are normally maintained constant, for example at 90° or 180°, for a particular embodiment of the invention. Moreover, there is no selective focusing, nor any other attempt to manipulate the spatial direction or density distribution of the illuminating radiation pulses. Each pulse typically impinges as a plane wave parallel to a face of a cubical volume straight against a face of the cube, and passes straight through the entire volume. Pulse timing is the all-important determinate of where changes (in the event of writing or erasing), or detections (in the event of reading), transpire within the volume of radiation-sensitive medium.

This is considerably different than most, if not all, previous optical volume memory addressing schemes where radiation beams were simply directionally concentrated upon the volume portions where changes were to be made (possibly even by process of two-photon absorption), but where the illuminating beams were not positively temporally (as well as spatially) controlled. In accordance with the present invention, the (directionally) intersecting beams are further positively controlled both (i) duration, and (ii) time relationship (alternatively called time sequence, or phase).

When the radiation illumination of the volume of radiation-sensitive medium is controlled so as to be in the form of time-sequenced radiation pulses—as it is in the 2-P 4-D memory of the present invention—undesired changes outside the addressed domains of the volume will, for all practical purposes, become physically impossible. Accordingly, the 2-P 4-D memory will have a high figure of merit for selectivity, and considerable resistance to cumulative contamination during repetitive use.

Continuing with the write operation, if the radiation-sensitive medium at the addressed domains is already in its second state then it is unchanged by radiation of this first energy level. The radiation-sensitive medium is insensitive to the energy of either write radiation pulse taken alone, and nowhere within the entire 3-D volume is the radiation-sensitive medium changed in the slightest by either write radiation pulse taken individually.

Each domain within the 3-D volume of radiation-sensitive medium is also read by process of two-photon interaction. A domain is so read upon such times as two radiation pulses—one of which radiation pulses may also be a pulse otherwise used for writing and which two pulses taken together have a joint energy that aggregates a predetermined second energy level less than the first energy level—again temporally and spatially intersect in the domain, interacting therewith. The radiation-sensitive medium is totally insensitive to radiation of this aggregate second energy level, as well as to the energy of either beam taken individually, to change in the slightest, let alone to change state. Accordingly, reading is non-destructive.

Considering the previous paragraph, one way of describing the response of the 2-P 4-D radiation memory during reading is to say that it is selectively transparent. Neither radiation pulse can "see" anything within the volume of radiation-sensitive medium save that it temporally and spatially intersects the other pulse, and then only to the time extent and over the spatial interval where such intersection satisfies the quantum-mechanical equations of two-photon interaction. Both pulses "see" the same thing (if the molecules of the radiation-sensitive medium are randomly aligned, as is normal) at their locations of intersection, and each is modified in the same way.

Note that in the two-photon interaction each and both radiation pulses are not modified in accordance with their individual characteristics (such as frequency, and energy), but are modified identically accordance with the two-photon interaction. Both read radiation pulses accordingly "see" the same thing, and both are commonly detected so as to permit real-time redundant checking of the correct operation of the 2-P 4-D radiation memory.

Remarkably for a radiation memory that already has two (2) separate and redundant read radiation outputs (each of which is independently detectable in an associated array of photodetectors or the like), there is yet further radiation output from the memory during reading. The two stable indices of refraction selectively assumable by the radiation-sensitive medium represent, in the preferred spirobenzopyran radiation-sensitive medium, two different isomeric molecular forms of this spirobenzopyran medium. During reading each intersection domain will selectively fluoresce dependent upon its pre-existing isomeric molecular form.

This incoherent fluorescence occurs at a separate wavelength and frequency from each of the selectively transmitted read light pulses. It is also detectable by photodetectors or the like. Although detectable at any angle to the volume, the intersection domains will be unambiguously resolved only along an axis of illumination. The fluorescent light emissions may be split out from the coherent, illuminating, read radiation pulses also transmitted along these illumination axis by beamsplitters and like devices. Note that, because the fluorescent light emissions travel in all directions (unlike the directional read radiation pulses), such beamsplitters can be located in the path(s) of either of both read radiation pulses in locations before the volume of radiation-sensitive medium. Because there is little problem with laser production of read radiation pulses sufficiently intense so as to overcome any losses in a beamsplitter, there is little, or no, problem to redundantly detecting the fluorescence along one or both illumination axis, providing yet another redundant detection of the data stored in the intersection domains.

Although unnecessary for operation as a memory, and although projected to be uncommon during normal usage of the 2-P 4-D radiation memory, each domain within the 3-D volume of radiation-sensitive medium can still further be erased (changed from its second to its first state). Erasure is again by process of two-photon interaction, particularly two-photon absorption. A domain is erased upon such times as two radiation pulses—one of which radiation pulses may also be a pulse otherwise used for writing and/or reading and which two radiation pulses taken together have a joint energy that aggregates a predetermined third energy level that is greater than the first (and second) energy level—temporally and spatially intersect within the domain, interacting therewith by two-photon absorption.

The radiation-sensitive medium within each intersection domain is responsive to radiation of this third energy level to change from its second to its first state. If the radiation-sensitive medium is already in its second state then it is unchanged by radiation of the third energy level. The radiation-sensitive medium is insensitive to the energy of either illuminating erase radiation pulse taken alone, and is nowhere within the entire 3-D volume is the radiation-sensitive medium changed in the slightest by either erase radiation pulse taken individually.

2. The Fourth Dimension (4-D) of the 2-P 4-D Radiation Memory

The radiation memory of the present invention is deservingly called four-dimensional, or "4-D" for at least two reasons.

First, and as previously explained, fluorescence from the intersection domains can be detected, preferably along one or both illumination axis, to provide yet another redundant detection of the data that is stored within the intersection domains. The fluorescent light output is at a different frequency and wavelength from either of the read radiation pulses (that are both selectively refracted in their transmission through the volume of radiation-sensitive medium by the pre-existing indices of refraction stored in the intersection domains). Because each frequency of light output is a separate dimension, the radiation memory of the present invention is "4-D".

Second, the (i) three-dimensional (3-D) volume of a medium that is sensitive to radiation in its absorption band to undergo an anomalous change in index of refraction, and (ii) the manner of radiatively defining, changing and detecting selected domains within the 3-D volume of radiation-sensitive medium by process of two-photon (2-P) absorption, together also constitute a fourth dimension (4-D) to a standard 2-P 3-D radiation memory. Together they serve to make a radiation memory four dimensional (4-D) in a way that the inducement of selective changes in isomeric molecular form by process of two-photon absorption that is taught within the companion predecessor patent applications do not.

To understand why this is so, and the second reason why the present radiation memory is deservedly called four-dimensional (4-D) rather than three-dimensional (3-D), consider the following. First—and although any radiation pulse or beam will be somewhat affected by passage through a great length of radiation sensitive medium—in accordance with the present invention a single radiation pulse is substantially unaffected by any and all domains of varying refractive index through which it passes so long as it does not undergo interaction with any domain or domains by process of two-photon absorption. Indeed, the single radiation pulse is likely totally unaffected within measurement limits during its passage through short, fractional meter, lengths of a radiation sensitive medium.

Accordingly, if the dimension of a three-dimensional (3-D) volume of radiation-sensitive medium having domains that exhibit varying indices of refraction is kept quite small—say on the order of one centimeter (1 cm.)—then a single radiation pulse (or beam) of less than threshold energy will pass through the medium substantially totally unaffected in any way, and will incur refraction if, when and where—and only if, when and where—it both spatially and temporally intersects a second radiation beam of appropriate energy. One way of regarding this phenomena is to consider that the radiation-sensitive medium is transparent to the single radiation pulse or beam save only where, and when, it is selectively rendered non-transparent by a temporally and spatially intersecting pulse or beam (of appropriate energy).

Consider the involvement of time. A radiation pulse—whether used for writing or for reading or for erasing—interacts with the radiation-sensitive medium only at the particular location(s) where it is both spatially and also temporally coincidence with an intersecting pulse. The two pulses affect, and are most substantially affected by, the radiation-sensitive medium not only at the location(s) of their spatial, but also of their temporal, intersection. This means that both radiation pulses both modify, and are themselves modified, in a temporal (time), or fourth, dimension—as well as in the three spatial dimensions.

3. Definition and Selection of the Intersection Domains

The 2-P 4-D radiation memory of the present invention makes use of its temporal, or time, dimension—which is why it is so named "4-D"—in the addressing of domains within the 3-D volume of radiation-sensitive medium.

Consider reading. Each of two mutually intersecting radiation pulses exiting the volume of radiation-sensitive medium will bear the record of the refractive index of only the domains in which each pulse has intersected the other during its passage. Each pulse passes through the volume of radiation-sensitive media at near light speed, typically some substantial fraction of $3 \times 10^8$ meters per second. During the course of its passage each pulse intersects the other in sharply defined and located regions called domains. The volume (size) of the domains is set by (i) the speed of the pulses in the radiation-sensitive medium, and (ii) and the quantum mechanical requirement that the two pulses must be spatially and temporally coincident for a sufficient time and space so as to interact with the radiation-sensitive medium.

Curiously, and beneficially, the duration of a pulse need not be so short as the time it takes to traverse a domain that the pulse (and its companion pulse) serve to define. Consider that if each radiation pulse is traveling at some substantial portion of $3 \times 10^8$ meters/second, and if the volume of radiation-sensitive medium is on the order of 1 $cm^3$, and if this volume is divided into $2 \times 10^3$ by $2 \times 10^3$ by $2 \times 10^3$ (i.e., $8 \times 10^9$) domains, then, if half the distance in each of three co-ordinate directions is devoted to domains (i.e., one-eighth the volume), then the dimension of each domain will be about $2.5 \times 10^{-7}$ meters and each beam will traverse this distance in about 8 femtoseconds ($8 \times 10^{-15}$ seconds). Laser pulses this short can be generated, but only with difficulty. Luckily, however, the quantum-mechanical equations of two-photon absorption require that each of two pulse should be considerably longer than 8 femtoseconds if it is to react by process of two-photon absorption over a distance of $2.5 \times 10^{-7}$ meters. In fact, each radiation pulse has a quite manageable length of about 10 picoseconds ($10 \times 10^{-12}$ seconds). Each intersection domain has a dimension of about $(2.5 \times 10^{-5}$ meters$)^3$, and $2 \times 10^3$ by $2 \times 10^3$ by $2 \times 10^3$ such domains (i.e., $8 \times 10^9$ total domains) fit within a three-dimensional volume of one cubic centimeter (1 $cm^3$) with as much spacing in any co-ordinate direction between adjacent domains as the domains extend in that direction. (A "safety" margin this great, or 100% margins, is not required, but the radiation-sensitive photochromic medium in its polymer matrix is exceedingly inexpensive, and there is little need to tightly pack the domains.)

As a final step to selecting one multiplicity of domains to be read, written, or erased during any one cycle, out of the very great number of domains that are within the entire volume, one of the pulses is variably delayed relative to the other pulse. If the radiation pulses intersect at other than 180° (i.e., counter-propagating), and, for example, if the radiation pulses intersect at 90° (i.e., perpendicular) then one pulse must be so variably delayed in each of various regions of its planar wavefront to a different degree.

The nature of this requirement, and the manner of so doing, is a bit challenging, and will be taught in conjunction with FIG. 4. However, three things are simple to understand.

First, the reason why—for pulses that are not counter-propagating—"one pulse must be so variably delayed in each of various regions of its planar wavefront to a different degree" is simply this: each straight line path through the 3-D volume of radiation sensitive medium from the source of each pulse to the detection of each pulse must intersect the other pulse (in space and it time) at one only domain. In other words, a pulse traveling along a single line carries the information to change but a single intersection domain, and in its further path beyond the intersection domain, carries the information of but this one domain. Alas, the manner of controlling the delay, or phase, of various regions of the pulse wavefront required to realize this straightforward requirement is conceptually difficult.

Second, even though the selective control of the delay, or phase, of various regions of one pulse wavefront in order to realize non-redundancy in the paths of both pulses (when intersecting at other than 180°) is sophisticated, the mechanism for putting the required time, or phase, delay into each pulse wavefront region is well known. A multiplicity of different phase delays may be applied to a corresponding multiplicity of regions of the pulse wavefront by means no more complex than channeling the light of each region through an associated electro-optic or acousto-optic modulator.

Third, the entire requirement that the different regions of a pulse wavefront (as opposed to the entire pulse) should be variably delayed is completely obviated when the pulses are intersecting at 180°, or counter-propagating. Accordingly, for its simplicity and elegance, a intersection of counter-propagating pulses is a preferred embodiment of the invention. The regrettable reason why the another, unpreferred, embodiment is taught first in this specification is that domain selection in the counter-propagating wavefront 2-P 4-D memory transpires almost entirely in the time domain, and would better be illustrated by a motion picture or videotape than the static drawings of a patent application.

These and other aspects and attributes of the present invention will become increasingly clear upon reference to the following drawings and accompanying specification.

DETAILED DESCRIPTION OF THE PREFERRED EMBODIMENT

Figure 1:
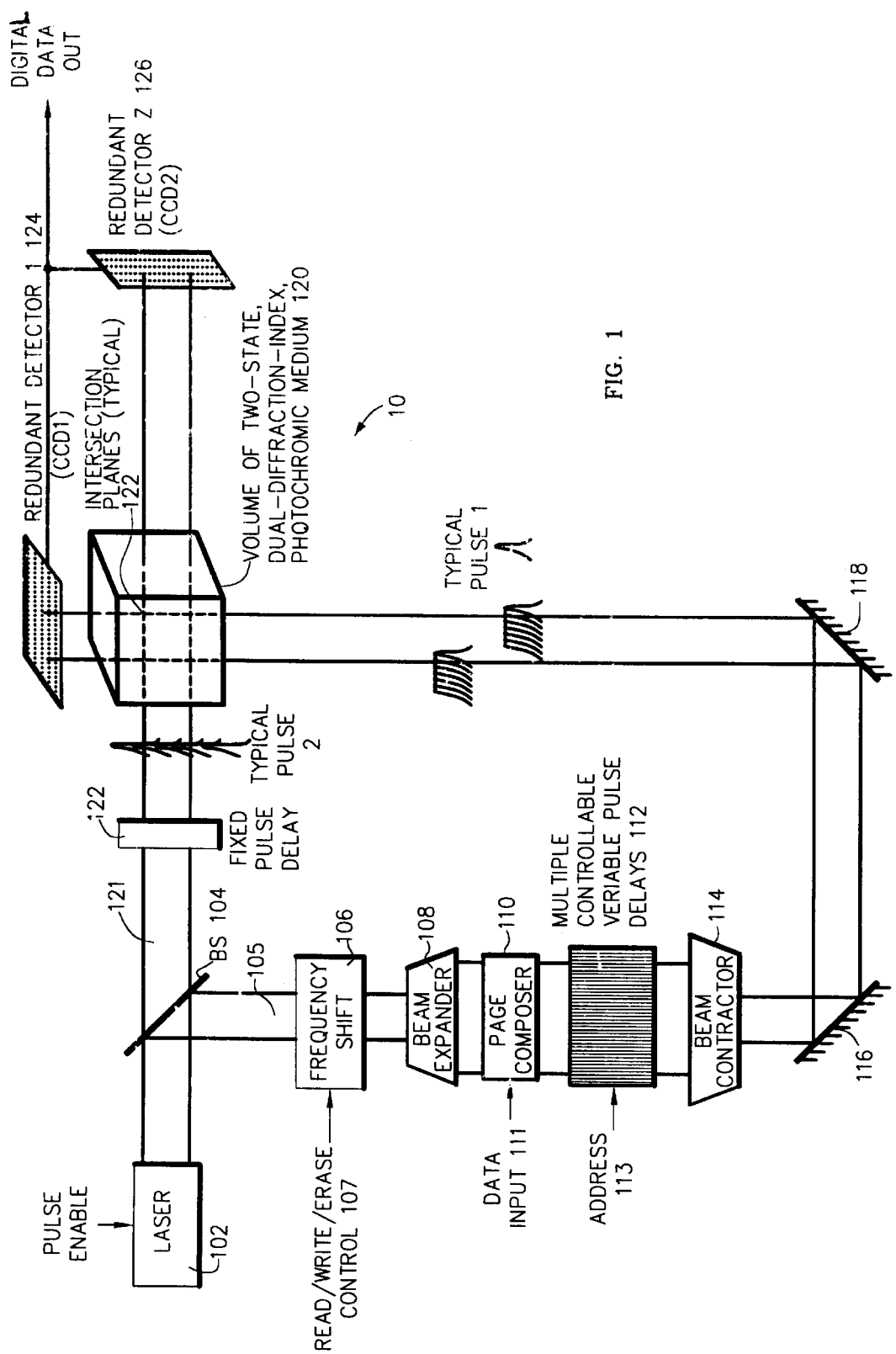
FIG. 1 is a diagrammatic representation of an embodiment of a radiation memory in accordance with the present invention showing the principle of optically addressing domains inside a volume of radiation-sensitive medium by use of two radiation pulses, herein orthogonal to each other, that are synchronized in time so as to be simultaneously intersecting in selected regions of the medium to interact thereat by process of two-photon interaction.

1. Detail Theory of Operation of the 2-P 4-D Radiation Memory

1.1 General Theory of the Radiation-Sensitive Medium

The three-dimensional volume of the radiation-sensitive medium of a 2-P 4-D radiation memory in accordance with the present invention is written, read and erased by the process of two-photon ("2-P") interaction. During writing the radiation-sensitive medium is sensitive to radiation in its absorption band so as to undergo an anomalous, stable, change in its index of refraction. One suitable radiation-sensitive medium is the same photochromic chemical spirobenzopyran that is taught within the related, companion, patent applications.

A "stable change in the index of refraction" means as follows. The index of refraction refers to the effect the medium has on the passage of radiation, particularly light radiation. A change in the index of refraction particularly affects the ability of the medium to transmit radiation, namely light. The medium may be considered to be relatively more opaque when and where possessed of a one index of refraction, and relatively more transparent when and where possessed of the other index of refraction.

Obviously these effects are desirably as great as is possible to improve the signal to noise of any detection based on the selective transmission of light. However, change in the index of refraction of the photochromic, radiation-sensitive, medium need not be 100%—changing from totally opaque to totally transparent—in order for the medium and its refractive index change to be useful in a radiation memory. The detectors can be "zeroed" to the average received radiation (light) intensity of one refractive index state of the medium, and it is only necessary that the effect on light transmission of the other refractive index should be sufficiently different so as to be reliably detectable (preferably with non-exotic, convention light detectors such as charge-coupled devices) at an adequate signal to noise. Spirobenzopyran meets these criteria, as do other photochromic chemicals.

An "anomalous change in its index of refraction" means the following. The index of refraction of the radiation-sensitive medium is not the same for radiation of all wavelengths. The index of refraction of spirobenzopyran, and other photochromic chemicals, typically follows a knee-shaped curve with a greater index of refraction at shorter wavelengths (higher-frequency, higher-energy radiation), and a lower index of refraction at longer wavelengths (lower-frequency, lower-energy radiation). The index of refraction varies sharply by some multiples between, for example, a high index of refraction at a shorter wavelength of, typically, about 200 nanometers and a low index of refraction at a longer wavelength of, typically, about 500 nanometers. Remember, this differing index of refraction with radiation wavelength (or frequency, or energy) is an intrinsic, and quite normal, property of the photochromic medium, particularly spirobenzopyran, and has, as of yet, nothing to do with any induced changes in the index of refraction, or the detection of these changes.

Now consider what this means to illumination of a volume of the radiation-sensitive medium with radiation of varying wavelengths. Relatively longer wavelength, relatively lower frequency, relatively lower energy radiation sees a relatively lower index of refraction in passage through the volume than does relatively shorter wavelength, relatively higher frequency, relatively higher energy radiation. Suppose the index of radiation were to change by certain percentage, say 50%. The relatively longer wavelength, relatively lower frequency, relatively lower energy radiation would still see but a relatively small (albeit 150% of previous) index of refraction, and might be considered to pass through the radiation-sensitive medium relatively unaffected and undeflected. Relatively shorter wavelength, relatively higher frequency, relatively higher energy radiation would, however, see in passage through the same medium 150% of a previously relatively large index of refraction, an this relatively large absolute change in the index of refraction would be expected to produce a notable, and detectable deflection of the radiation.

So far all that has been said is that relatively shorter wavelength, relatively higher frequency, relatively higher energy radiation interacts more strongly with the radiation-sensitive medium, and any change in the index of refraction that it may undergo, than does relatively longer wavelength, relatively lower frequency, relatively lower energy radiation. Now consider reading by process of two-photon interaction. Two pulses of relatively longer wavelength, relatively lower frequency, relatively lower energy radiation are transmitted though the volume of radiation-sensitive medium. In its path each radiation pulse experiences relatively little affect from the small—be it 100% or 150%—refractive index of the regions through which the pulse travels. Each pulse continues relatively straight, undeflected and but very weakly interacted. When, however, one read pulse temporally and spatially intersects the other, interacting with the radiation-sensitive medium at the location(s) of intersection by process of two-photon interaction, the two relatively longer wavelength, relatively lower frequency, relatively lower energy radiation pulses together appear as a single, virtual, pulse of relatively shorter wavelength, relatively higher frequency, relatively higher energy radiation. But such pulse interacts strongly with the radiation-sensitive medium, and is greatly differently influenced depending upon whether the relatively high refractive index of the medium is 100%, or 150%.

Accordingly, when this concept is understood, then the elegance of two-photon interaction in a radiation memory for the detection (i.e., reading), and not just the generation (i.e., writing), of stable anomalous changes in the index of refraction of a radiation-sensitive, photochromic, medium may also be understood. Consider the utility of having a read radiation pulse substantially interact with the radiation-sensitive medium at only a controlled region of intersection (with another pulse) as follows. If each dimension of a cubical radiation memory is, for example, $2 \times 10^3$ domains, then a radiation pulse will have to travel though 1,999 domains to interact (by process of two photon interaction) at just one domain. The pulse cannot stand much, if any, interaction with the 1,999 "unaddressed" domains—all of which may permissively be in alternative state to the single "addressed" domain. In fact, if the level of interaction at each such "unaddressed" domain were but $\frac{1}{2000}$ of the interaction at the single "addressed" domain then approximately 50% of the total interaction undergone by the radiation pulse would be undesirable interaction. The affect of such undesired interactions could be opposite, and subtractive, from the single desired interaction. Worse, 1,999 such interactions could occur, "diluting" the read pulse by nearly 50%, before the one interaction that is of interest (i.e., the addressed domain is "last in line"). It is fairly obvious that interactions outside addressed domains must be strongly suppressed if the radiation memory of the present invention is to have a strong figure of merit in it immunity to "wash out", and in the signal to noise ratio of repeated and repetitive read detections in the memory regardless of where the detected domains are, and what data they may hold relative to all other domains in the memory. The radiation memory must be able to encompass, for example, writing every single domain (data bit) in the entire memory to one state (e.g., a binary "1") a million times and then reading the single domain of the opposite state (i.e., a binary "0") for a million times.

The preferred spirobenzopyran radiation-sensitive medium of the present invention will so function in a 2-P 4-D radiation memory as taught herein—at least when kept, circa 1994, physically relatively small, and preliminarily on the order of 1 cm$^3$. Other than improved photochemicals and/or detectors, one way to approach a larger volume might be three-photon absorption. Luckily, the steering of light radiation permits many 1 cm$^3$ to be organized in the manner of a "jukebox" drive to use but a single source of laser light pulses, a single data encoder, and single addressing mechanism, and a single set of (plural) detectors.

Moreover to its desirable characteristics, the particular radiation-sensitive medium spirobenzopyran also happens to undergo a change in isomeric molecular form between its two conditions that differ in index of refraction.

Finally, this particular radiation-sensitive medium also happens to fluoresce when excited with a certain energy, including excitation by two-photon interaction, from one (only) of its two isomeric molecular forms. In the related patent application detection of this selective fluorescence is the manner by which stored information is read form a 2-P 3-D radiation memory. The selective fluorescent emissions during reading, and the information that is within these emissions, is completely present and unabated in any manner whatsoever, in the 2-P 4-D memory of the present invention. The non-coherent emissions may be detected, and may serve as a check on the coherent radiation selectively transmitted by the 2-P 4-D radiation memory. The 2-P 4-D radiation memory of the present invention correspondingly offers, as a normal incidence of its normal read operation and without any special or extra "cost", a plethora of outputs. Namely, each of the two read pulse will bear the complete information of the intersection regions. Moreover, and although the fluorescence of the read domains can be detected anywhere, at least along the same axis as the two read pulses, fluorescent light (of a different frequency from either, and from both, read pulses) emitted form the intersection domains may be uniquely resolved, and bears the full information of the informational content of these domains. All the emergent beams may, of course, be split and directed to appropriate detector arrays by beamsplitters, mirrors, lenses and other common optical elements. Succinctly, the 2-P 4-D radiation memory of the present invention has two (transmitted) coherent light outputs, and, at a different frequency, two incoherent (fluorescent) light outputs. Each frequency being a dimension, the radiation memory of the present invention truly deserves to be called "4-D".

The preferred energy sensitive medium—spirobenzopyran—is stably held in a matrix of polymer plastic, forming a typically centimeter-size small, typically milky white, cube that resembles a cube of common table sugar.

1.2 General Theory of the Two-Photon Interaction

During any of 2-P writing, reading or erasing, the radiation-sensitive medium is illuminated by a pulse of radiation, preferably a 10 picosecond ($10 \times 10^{-9}$ seconds) pulse of laser light, along each of two intersecting paths. The separate pulses along one or both paths vary in frequency, and in energy (E=hν), dependent upon whether they are being used to write, read or erase the volume radiation memory. However, during any of the operations of writing, reading or erasing each pulse taken alone is always of a frequency, and of an associated energy (E=hν), that is insufficiently energetic so as to cause any change any part of the radiation-sensitive memory whatsoever.

During the process of writing the two write radiation pulses taken together jointly total a first energy sufficient so as to change the radiation-sensitive medium from its first to its second state.

During the process of reading the 2-P 4-D memory even the two read radiation pulses taken together jointly total a second energy level that is insufficient so as to affect any change in the radiation-sensitive medium at all, and regardless of which of its two states the medium should be in. The individual read radiation pulses but very weakly interact with all domains of the volume of radiation-sensitive medium through which the pulses pass save those sole, and only domains, where the other pulse is spatially and temporally intersected. No radiation can travel indefinitely in other than free space, and in any physical material even if the material is very substantially transparent, without some, very weak, interaction. However the "very weak interaction" of an individual read radiation pulses of the present invention with the radiation-sensitive medium is essentially at a level so that any changes accruing to pulse in passage through a centimeter of the medium is but a minute fraction of the magnitude of changes occurring at the sites, or domains, of intersection. Accordingly, detected regional changes in the intensity of each transmitted read radiation pulse are almost entirely attributable to the common sites, or domains, of intersection, and are but insignificantly attributable to any other radiation-sensitive medium (or anything else) through which each pulse has passed, regardless of the index(es) of refraction of the this additional material.

The preferred energy sensitive medium—spirobenzopyran—fluoresces at the intersection domains during reading. Although this phenomena is no longer the primary means of detecting the stored information as it was in the 2-P 3-D optical memories of the related predecessor patent applications.

Finally, during the process of erasing the 2-P 4-D memory the two erase radiation pulses taken together jointly total a third energy level that is greater than the first energy level (and therefore also the second energy level). The combined erase radiation pulses are sufficient in energy so as to change the radiation-sensitive medium from its second to its first state. Each pulse is individually insufficiently energetic so as to cause any change in the radiation-sensitive medium whatsoever.

The two orthogonal radiation pulses are, by the quantum mechanical equations of two photon interaction, of such short time durations that they temporally intersect to cause change by process of two-photon absorption only in very small volumes—defined as domains—within the radiation-sensitive medium. A typical domain has a dimension of 0.25 microns ($0.25 \times 10^{-6}$ meters). If a radiation pulse in the radiation-sensitive medium were to be traveling at the speed of light in free space (which it is not), then it would traverse this distance in approximately 8 fentoseconds ($16 \times 10^{-15}$ seconds). Although a laser light pulse can be made to be so short, it is not necessary to make the radiation pulses so short in order to define distinct, 0.25 micron size, domains of two-photon interaction within the 2-P 4-D memory of the present invention. Indeed, the radiation pulses are more commonly approximately 10 picoseconds ($10 \times 10^{-12}$ seconds) in duration.

The spatial locations of the domains where the pulsed beams intersect constitute the selected domains.

Information is two-dimensionally spatially encoded on the planar wave fronts of one or both beams—normally on one beam only. Those selected domains that are both (i) located at the spatial and temporal intersections of both pulsed radiation beams, and (ii) two-dimensionally spatially-encoded on the wavefront of at least one beam, are changed, or written, to the first state by process of two-photon absorption.

During 2-P reading two pulsed radiation beams—each of which beams is alone insufficiently energetic so as to cause any change any part of the radiation-sensitive memory whatsoever but which two beams together jointly total a second energy level that is less than the first energy level—again illuminate the radiation-sensitive medium along each of two, preferably orthogonal, axis. The two pulsed read beams normally travel in the same direction along the same two axis as did the two write beams. The two pulsed read beams also temporally and spatially intersect in selected domains of the volume of radiation-sensitive medium.

Both read beams are substantially refracted only by those selected domains where they intersect, and both beams are cumulatively refracted to only a minor degree by the remaining volume of the radiation-sensitive medium. Dependent upon whether each individually selected domain is in its first, or in its second, state, the domain will cause that a respective portion of each beam impinging on the domain (spatially and temporally simultaneously with the other beam) either will, or will not, deflect and focus to a respective location on a corresponding one of two, two-dimensional image planes that are located outside the radiation-sensitive medium.

In effect, each domain acts like a miniature omnidirectional lens, or phase hologram, owing to the anomalous index of refraction change. During the read operation the information that is stored within the selected, intersection, domains is imaged onto each of two image planes. Each of these two image planes receives, within the limitations of radiation (optical) noise, a wavefront of radiation that is identically two-dimensionally spatially-encoded to the wavefront that is received at the other image plane. Accordingly, readout is redundant.

The wavefront of radiation received at each image plane is detected by an electro-optic detector, typically a Charge-Coupled Device (CCD) nominally of an array size 2K by 2K bits ($(2 \times 10^3) \times (2 \times 10^3)$). For the purposes of immunity to noise, it is preferred to redundantly detect the two-dimensional spatially-encoded radiation wavefront at each image plane. The information detected at each image plane is normally electronically compared region by region, and bit by bit. The comparison serves as a redundant detection of the information that was stored within the selected domains, and as a means of detecting any error.

1.3 Details of Addressing the 2-P 4-D Optical Memory in Accordance with the Present Invention It will by now be understood that addressing of selected domains within the radiation-sensitive medium for purposes of any of writing, reading or erasing is by use of two intersecting pulses of radiation. It will also be understood that during writing (and optionally during erasing also), one of the pulses is two-dimensionally spatially encoded with information that is to be written or erased.

If each pulse is, for example, in a plane than the two moving plane waves of both pulses will intersect, as they move through the volume of radiation-sensitive medium, in yet another plane. If the volume of radiation-sensitive medium is in the shape of a cube, as is preferred, then this intersection plane will fall diagonally across the cube, (i) bisecting each of two of the mathematical combinations of the cube's three axis taken two at a time (i.e., by pairs), and (ii) containing one axis of the cube.

In order to address a different multiplicity of domains within the volume of radiation-sensitive medium, it is necessary, and logical, to delay one of the plane wave radiation pulses relative to the other. Alas, simply delaying the entirety of a plane wave radiation pulse will, while truly serving to define a new diagonal plane containing new domains within the cubical volume of radiation-sensitive medium, fail to define a new diagonal plane of intersection that is so large as, and that contains so many domains as are on, the main diagonal plane of the cubical volume. Indeed, with increasing (or decreasing) time delay to one radiation pulse (relative to the other), the minor diagonal planes of intersection gradually move, with successively increasing relative delay between plane wave radiation pulses, towards a one edge of the cubical volume until, at the last and only region of intersection within the cubical volume, a single line of domains is addressed along a single cube edge. Later discussion of FIG. 4 will make this clear.

Obviously something more sophisticated—although hopefully only slightly so—than a gross time delay to the entirety of one radiation pulse (relative to the other) is needed to accurately define, and address, an equal multiplicity of domains within the (nominally cubical) volume of radiation-sensitive medium upon each and every cycle.

In accordance with the present invention, and in order to correctly and accurately select an equal multiplicity of domains to be read, written, or erased during any one cycle, in all of the intersection embodiments of the invention except counter-propagation one of the plane wave radiation pulses—normally the same one that is encoded or that becomes encoded with information—is delayed in each of various regions of its planar wavefront to a different degree. Moreover, from one memory cycle to the next as serves to address one multiplicity of domains to the next, these different delays in each of various regions of its planar wavefront are all individually varied. Moreover, the different delays are not so individually varied uniformly nor to the same magnitude; some delays decreasing while others increase, and vice versa. This also will be made increasingly clear during discussion of FIG. 4.

Despite the seeming complexity of these variably different delays—and there are many schemes, or patterns, of individually varying the delays of each of the regions of a planar wavefront of a radiation beam from cycle to cycle nonetheless that the delays of all such regions remain distinct, and different, upon each and all cycles—the organizing principle by which the delays are applied both spatially (in the regions of the radiation wavefront) and temporally (from cycle to cycle) is straightforward: on any path of either radiation pulse through the radiation-sensitive medium (on its way to a radiation detector), it (i) will intersect the other radiation pulse, and (ii) will so intersect the other radiation pulse in one, and only one, domain.

Consider the embodiment of the 2-P 4-D radiation memory of the present invention where the two radiation pulses are perpendicular to each other, each impinging as a wavefront upon, and parallel to, a respective side of a cubical volume of radiation-sensitive medium. One, first, radiation pulse is typically presented to, and passes though, the cubical volume of radiation-sensitive medium as a simple planar wavefront. The other, second, radiation pulse is only initially formed as a planar wavefront, or planar pulse. This second radiation pulse is delayed, and variably delayed, in its two-dimensional regions before it is presented to the cubical volume of radiation-sensitive medium, before it passes therethrough, and before it interacts with the first radiation pulse therein.

The second plane wave radiation pulse may be considered to divided into a first multiplicity of regions that are located along each of a second multiplicity of spaced-parallel lines, each of which lines is parallel to the propagation vector of the first plane wave radiation pulse. The second multiplicity is typically equal to the first multiplicity, and more typically $2 \times 10^3$ such regions are located along each of $2 \times 10^3$ spaced-parallel lines. The radiation flux from at least each of the first multiplicity of regions passes though an associated individual delay means, and may be individually controllably delayed in its further transmission. The corresponding regions as are upon each of the second multiplicity of lines may, and preferably do, share a delay means, making that corresponding regions of the first multiplicity of regions as appear upon each of the second multiplicity of lines are variably controllably delayed to any amount, but are so delayed equally.

Each of the first multiplicity of regions (of the $2 \times 10^3$ such regions) that are upon a one spaced-parallel line can either be (i) delayed to a different extent than any or all other regions, (ii) delayed to the same extent as any or all other regions, or (iii) not delayed at all. The extent to which radiation wavefront regions that are upon each line are delayed serves to regionally differently delay the second (normally the spatially-modulated) radiation pulse as it passes through the three-dimensional volume of the radiation-sensitive medium. If an imaginary "snapshot" in time were to be taken of the regionally-differently-delayed spatially-modulated plane wave in its passage through the volume of radiation-sensitive medium, then there would be but one, and only one, region of the wavefront present upon any one line (wherein the spaced-parallel lines will be remembered to be parallel to the propagation vector of the other, first, plane wave radiation pulse).

Accordingly, no matter where, and how far, the second plane wave radiation pulse has propagated along an imaginary straight line within the volume of radiation-sensitive medium, it can be intersecting along that line with but one, an only one, occurrence of the other radiation pulse—and vice versa. When each plane wave pulse reaches its associated detector then it will have interacted by process of two-photon absorption with the other pulse in but one, unambiguous, location along its entire path traveled along an imaginary straight line through the radiation-sensitive medium. This single location of interaction upon each line is, or course, the location that is being addressably read, written or erased.

1.4 The 2-P 4-D Radiation Memory of the Present Invention has a Sensitive Readout, and this Rebounds to the Compact Size of the Memory and its Use of Only Short Read and Write Pulses of Reasonable Magnitude By this point in the explanation of the 2-P 4-D optical memory in accordance with the present invention, it may be appreciated that the energy detected during the reading, as well as the energy used during the writing and erasing, of the dual states of the domains within the three-dimensional volume of energy-sensitive medium comes directly from outside the volume, and typically from a laser. Although the laser pulse is relatively short, it can be made as bright as is required, meaning that each pulse contains a large number of photons suitable to interact with the photons of the other pulsed beam in the intersection regions. Detection of the fluorescence of the domains—which fluorescence may be feeble—is not of the essence during read operations of the 2-P 4-D radiation memory of the present invention as it was for the 2-P 3-D optical memories of the related patent applications. Instead, in the 2-P 4-D radiation memory of the present invention a direct detection of the information stored within the intersection domains occurs by detecting the influence of the differing refractive indices of these domains on the radiation transmitted through each. In one refractive index "state" a domain will permit a certain percentage of the received, and two-photon-interacted, radiation to be further transmitted in a straight line to a particular corresponding point on the detector array. In its other refractive index "state" the same domain will permit a different percentage of the received, and two-photon-interacted, radiation to be further transmitted along the same straight line to the same point on the same detector array.

The detector sensitivity can be adjusted, or zeroed, or double zeroed, for the receipt of radiation through domains of either, or of both, states and associated refractive indices. Any received radiation that is above (or below) a predetermined threshold can quite readily be detected as an indication that the domain is within the opposite state. Although the difference between the two indices of refraction that are associated with the two states of the radiation-sensitive medium (typically 15%) is not so great so as to cause a difference in transmitted radiation as great as is the color difference between black and white (i.e., 100%), or as is the transmission difference between opaque and transparent (i.e., 100%), the difference in transmitted radiation between the two alternative indices of refraction is great enough for reliable detection. Note that the sensitivity and resolving power of a CCD is actually greater than the human eye (typically×100 grater). Accordingly, a rough analogy to the entire process of reading the 2-P 4-D memory can be drawn to the viewing of a hologram with one eye, and it should not be surprising that a great multiplicity of regions, and corresponding bits, can be reliably repetitively accurately resolved and detected.

Moreover, because detection is sensitive, the domains need not be voluminous, nor need many molecules within a domain be changed in state in order that the changed state should subsequently be detectable. Because the memory medium is inexpensive, and in accordance with the principles of optics will scale upwards or downwards in size, the primary advantage of sensitive detection is that it permits the write cycle to be commensurately shortened while using only modest, and readily realizable, laser radiation fluxes.

1.5 The 2-P 4-D Radiation Memory of the Present Invention Stores Information in Three-Dimensionally Arrayed Domains, but Can Accurately Selectively Locate a Two Dimensional Array of Domains to Be Written, Read or Erased with but Low Noise and Low Crosstalk During a Cycle Time The 2-P 4-D radiation memory of the present invention stores information in a three-dimensionally array of domains. However, the writing, reading and erasing of information from these domains is accomplished on but a two dimensional array of domains at any one cycle time.

Heretofore, and as analyzed by Gaylord, two-beam writing of page organized holograms in a volume holographic memory has created holograms with very strong angular selectivity. That is, in order to read out the data in a written hologram, the reference beam must be variably steered to illuminate the hologram with very precise angular orientation, typically about 0.0005° for optical frequencies and configurations like as to the 2-P 4-D memory of the present invention. Illumination slightly outside this narrow corridor produces a very rapidly decreasing intensity of reconstructed data. This type of angular behavior is not observed in thin holograms. In fact, its presence in volume holograms is nothing more than a manifestation of the higher information capacity of volume holographic storage.

One advance of both the present invention, and the related inventions of the companion patent applications, is that two-dimensionally organized information can be radiatively written and retrieved from, an stored within, a three-dimensional volume optical memory store. However, in the inventions of the companion patent applications, this two-dimensionally organized information was difficult to precisely fix, and locate, in three-dimensional space, and required exotic devices such as holographic dynamic focusing lenses to do so.

A particular advance of the present invention is not only that true one two-dimensional holograms may be written and read by a two-beam two-photon process, but that true 2-D holograms might be readily, tightly and accurately "stacked" in three-dimensions by use of but common, readily available, and well proven optical components. Essentially, the 2-D holograms are cleanly and accurately resolved by adjustment of the phase of intersecting radiation pulses (and regions of such pulses)—an adjustment transpiring in the fourth dimension of time. Accordingly, the use of time, or phase, in addressing the radiation memory of the present invention—as well as the storage of information in the form of changes to the index of refraction—again justifies that the radiation memory should be called two-photon four-dimensional (2-P 4-D). (It will be recalled that the first justification was the multiple frequency information-encoded light outputs of the 2-P 4-D radiation memory, where each frequency is a dimension.)

2. Detailed Description of the Preferred Embodiments

A schematic first embodiment 10 of a 2-P 4-d radiation memory in accordance with the present invention is shown in FIG. 1. A LASER 102 produces a radiation pulse of an appropriate energy. The LASER 102 may typically be a Nd:Yag diode pumped solid state laser. The light radiation pulse is split in a beam splitter BS 104 for distribution along each of two paths.

One of the two light pulses 105 optionally undergoes a frequency shift in FREQUENCY SHIFT 106 in response to READ/WRITE/ERASE CONTROL 107 in accordance whether the current operation is reading, writing or erasing. The FREQUENCY SHIFT 106 may be typically either an electro-optic or acousto-optic device.

Typically the same light pulse 105 that is shifted is also spatially encoded in its two-dimensional wavefront in the PAGE COMPOSER 110. The PAGE COMPOSER 110 may be, as is taught within the related companion patent applications, an array of spatial light modulators. Such a spatial light modulator, or SLM, should desirably perform electronic-optical conversions at high speed so that the access times to the 2-P 4-D optical memory can be made as short as possible. (A high-speed optical-electronic conversion is typically carried out by use of a sensitive optical detector array, and is not as troublesome nor, typically, as time consuming, as is the input of optical data to be written to the 2-P 4-D radiation memory.) The electronic-optical conversion at the input is preferably implemented by a type of SLM called an electronically addressed spatial light modulator, or E-A SLM. The input array must be able to channel enough radiation energy to write (by two-photon absorption) each of the selected domains. For future opto-electronic computers, the input and output arrays will be optically-addressed SLMs. For the present, the 2-P 4-D radiation memory—which commonly interfaces to an electronic computer—uses a E-A SLM that is preferably a sensitivity-enhanced silicon-PLZT SLM (Si/PLZT) as is taught by S. H. Lee, S. Esener, M. Title, and T. Drabik in the article "Two-Dimensional Si/PLZT Spatial Light Modulator Design Considerations and Technology" appearing in Optical Engineering 25, 250 (1986). Equivalent SLMs, such as those available from Hughes Aircraft Company, may alternatively be used.

Typically the same light pulse 105 that is spatially encoded in its two-dimensional wavefront in the PAGE COMPOSER 110 is also selectively temporally delayed in the regions of the same wavefront in the MULTIPLE CONTROLLABLE VARIABLE PULSE DELAYS 112. Each of the MULTIPLE CONTROLLABLE VARIABLE PULSE DELAYS 112 is typically either an electro-optic or acousto-optic device.

In accordance with the principles of optics, the light pulse 105 is normally expanded before so encoding with DATA INPUT, and before selectively delaying in accordance with ADDRESS 113, in a BEAM EXPANDER 108. After the light pulse 105 is (i) spatially encoded, and (ii) selectively delayed, in the regions of it's two-dimensional wavefront it is again typically scaled, again in accordance with the principles of optics, by a BEAM CONTRACTOR 114 so that it may be of appropriate size to the VOLUME OF TWO-STATE, DUAL-DIFFRACTION-INDEX, PHOTOCHROMIC MEDIUM 120. The spatially-encoded and spatially-selectively-delayed light pulse 105 is steered by mirrors 116, 118 as prove necessary to impinge upon the VOLUME OF TWO-STATE, DUAL-DIFFRACTION-INDEX, PHOTOCHROMIC MEDIUM 120. The selectively delayed condition of the wavefront of the light pulse 105 on its way to the VOLUME OF TWO-STATE, DUAL-DIFFRACTION-INDEX, PHOTOCHROMIC MEDIUM 120 is illustrated as, for example, the TYPICAL PULSE 1.

Likewise, the other light pulse 121 normally delayed in a FIXED PULSE DELAY 122 in order that it may be properly coincident with the light pulse 105 within the VOLUME OF TWO-STATE, DUAL-DIFFRACTION-INDEX, PHOTOCHROMIC MEDIUM 120. The delayed condition of the wavefront of the light pulse 105 on its way to the VOLUME OF TWO-STATE, DUAL-DIFFRACTION-INDEX, PHOTOCHROMIC MEDIUM 120 is illustrated as, for example, the TYPICAL PULSE 2.

The TYPICAL PULSE 1 and the TYPICAL PULSE 2 are spatially and temporally coincident at intersection regions within the VOLUME OF TWO-STATE, DUAL-DIFFRACTION-INDEX, PHOTOCHROMIC MEDIUM 120. These intersection regions may form, for example, the INTERSECTION PLANES (TYPICAL) 122. The interaction of each, and or both, pulses with the photochromic medium at these intersection regions is by process of two-photon interaction, and is governed by quantum mechanics.

The TYPICAL PULSE 1 as interacted with the intersection regions impinges, scaled if necessary by the use of lenses (not shown), upon the REDUNDANT DETECTOR 1 124, or Charge Coupled Device CCD 1. Likewise, the TYPICAL PULSE 2 as interacted with the same intersection regions impinges, again scaled if necessary by the use of lenses (not shown), upon the REDUNDANT DETECTOR 2 126, or Charge Coupled Device CCD 2. The data pattern that is impressed upon each pulse by and at the intersection domains will be read, and will be identical, at each of the detector arrays. The data developed at the detector arrays may be redundantly compared in order to detect any error, and is normally further transmitted to a computer or the like as DIGITAL DATA OUT 123.

2.1 Requirements for Variable Time Delaying Regions of the Wavefront of One Light Pulse Intersecting Another Light Pulse at Other than 180° (Other than Counter-Propagating)

If a one light pulse intersects another light pulse at other than 180° (counter-propagating) within the 2-P 4-D radiation memory of the present invention then addressing of the domains within the volume of radiation-sensitive medium requires that regions of the wavefront of one pulse should be variably time delayed relative to each other, and relative to the other light pulse.

Figure 2:
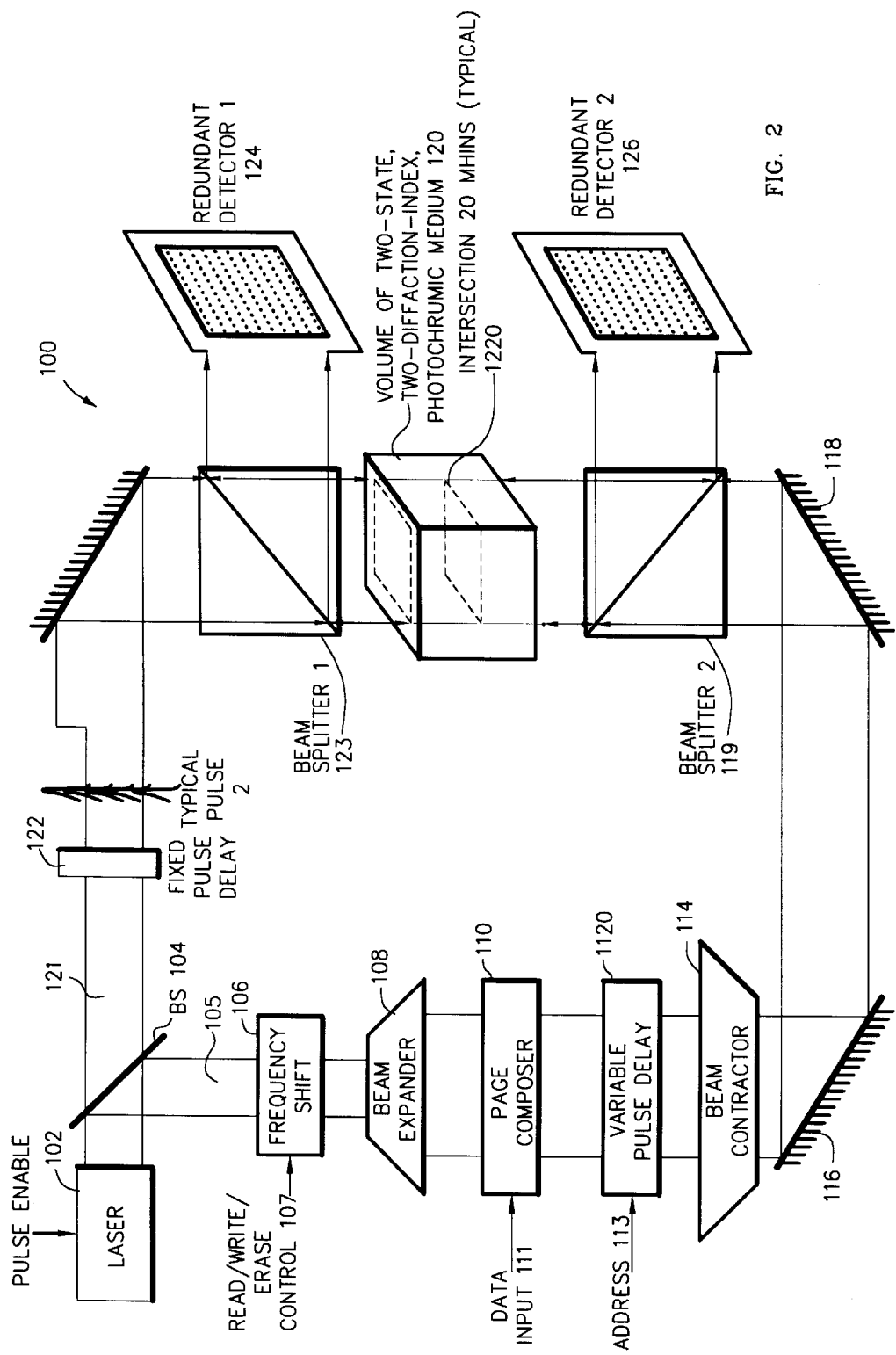
FIG. 2 is a diagrammatic representation of a preferred embodiment of a radiation memory in accordance with the present invention showing the principle of optically addressing domains inside a volume of radiation-sensitive medium by use of two radiation pulses, herein counter-propagating to each other, that are synchronized in time so as to be simultaneously intersecting in selected regions of the medium to interact thereat by process of two-photon interaction.
Figure 3:
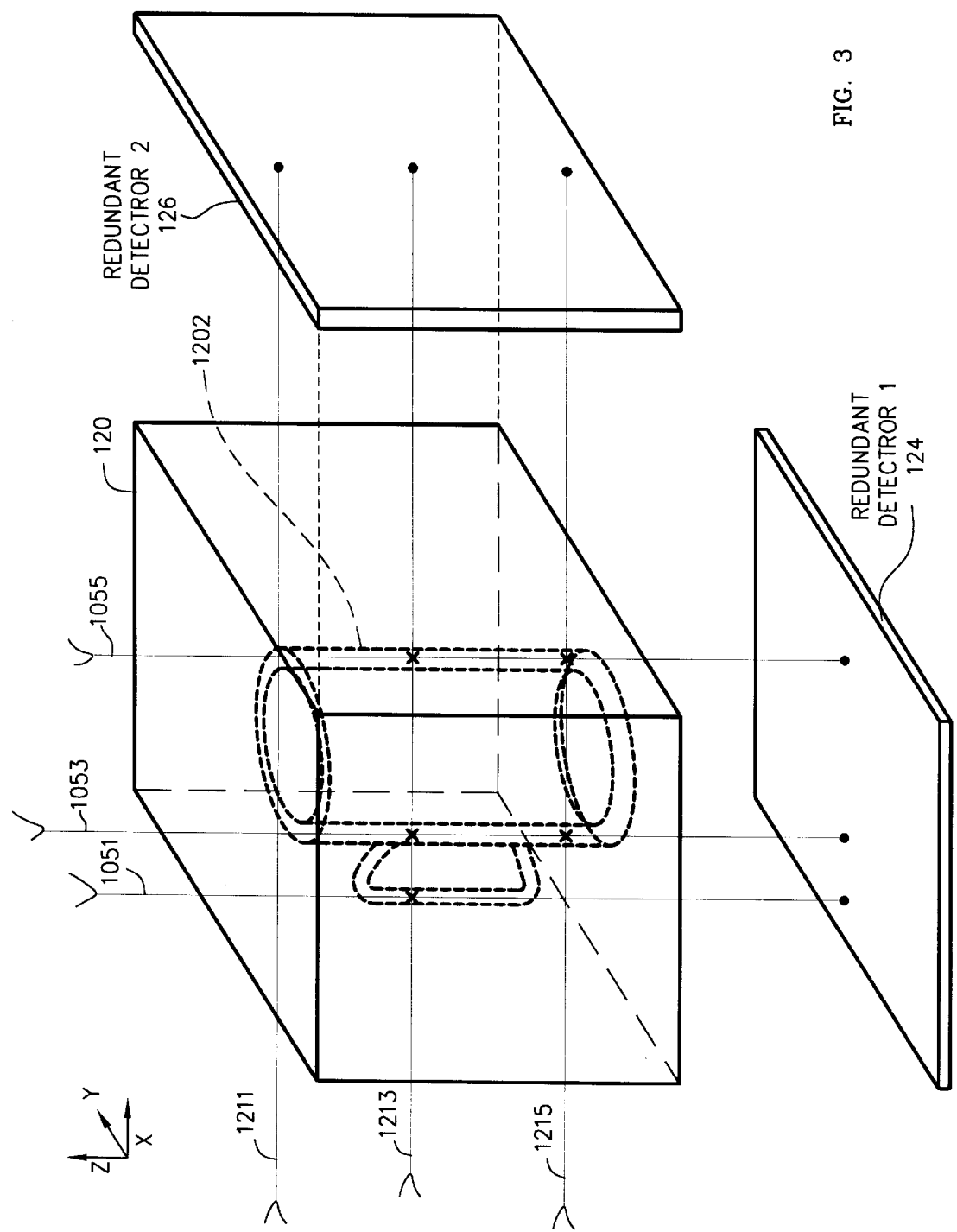
FIG. 3 is a diagram of the encoded storage of information, to wit: a three-dimensional representation of a coffee cup, within a three-dimensional volume of radiation-sensitive medium, and the insufficiency of detecting the stored information simply by regarding the effect on vectors of radiation that pass straight through the three-dimensional volume and interact with the information stored therein.

Skipping for the moment the counter-propagating embodiment of the 2-P 4-D optical memory shown in FIG. 2, consider FIG. 3. An "x-ray" view of the VOLUME OF TWO-STATE, DUAL-DIFFRACTION-INDEX, PHOTO- CHROMIC MEDIUM 120, previously seen in FIG. 1, shows the MEDIUM to contain, by way of example, a three-dimensional image of a coffee cup 1202. Rays 1051, 1053 and 1054 of a first light pulse 105 respectively intersect any of the rays 1211, 1213 and 1215 in domains that are changed in refractive index to store the three-dimensional image of the coffee cup 1202 at one, two and two points (1, 2 and 2). These points are marked with the letter "x". The rays may intersect at other points—for example ray 1051 intersects each of rays 1211, 1213 and 1215—but only limited points of intersection are within domains having a particular one refractive index.

Rays 1211, 1213 and 1215 of a second light pulse 121 likewise respectively intersect any of the rays 1051, 1053, 1055 in domains that are changed in refractive index to store the three-dimensional image of the coffee cup 1202 at zero, three and two points (0, 3 and 2). These same points are still marked with the letter "x".

Each of the rays 1051, 1053 and 1054 of a first light pulse 105 may be detected at the REDUNDANT DETECTOR 1 124 (previously seen in FIG. 1), and each of the rays 1211, 1213 and 1215 of the second light pulse 121 may likewise be detected at the REDUNDANT DETECTOR 2 126 (previously seen in FIG. 1).

The teaching of FIG. 3 is this. Even when the intersection domains are defined, selected and isolated by two-photon absorption, if a wavefront (not shown in FIG. 3) was to intersect, at the same time or over increasing time, over more than two domains that are upon a same straight line, or ray, then the detection of the state of either, and both, intersected regions would be ambiguous. The element of time is not shown in FIG. 3, as it will be in the sequence of FIG. 4. However, the concept is the same when the time domain is considered. Each intersection domain must map uniquely and unambiguously on to one only associated location on each detector array. This is not the case in FIG. 3.

Figure 4A:
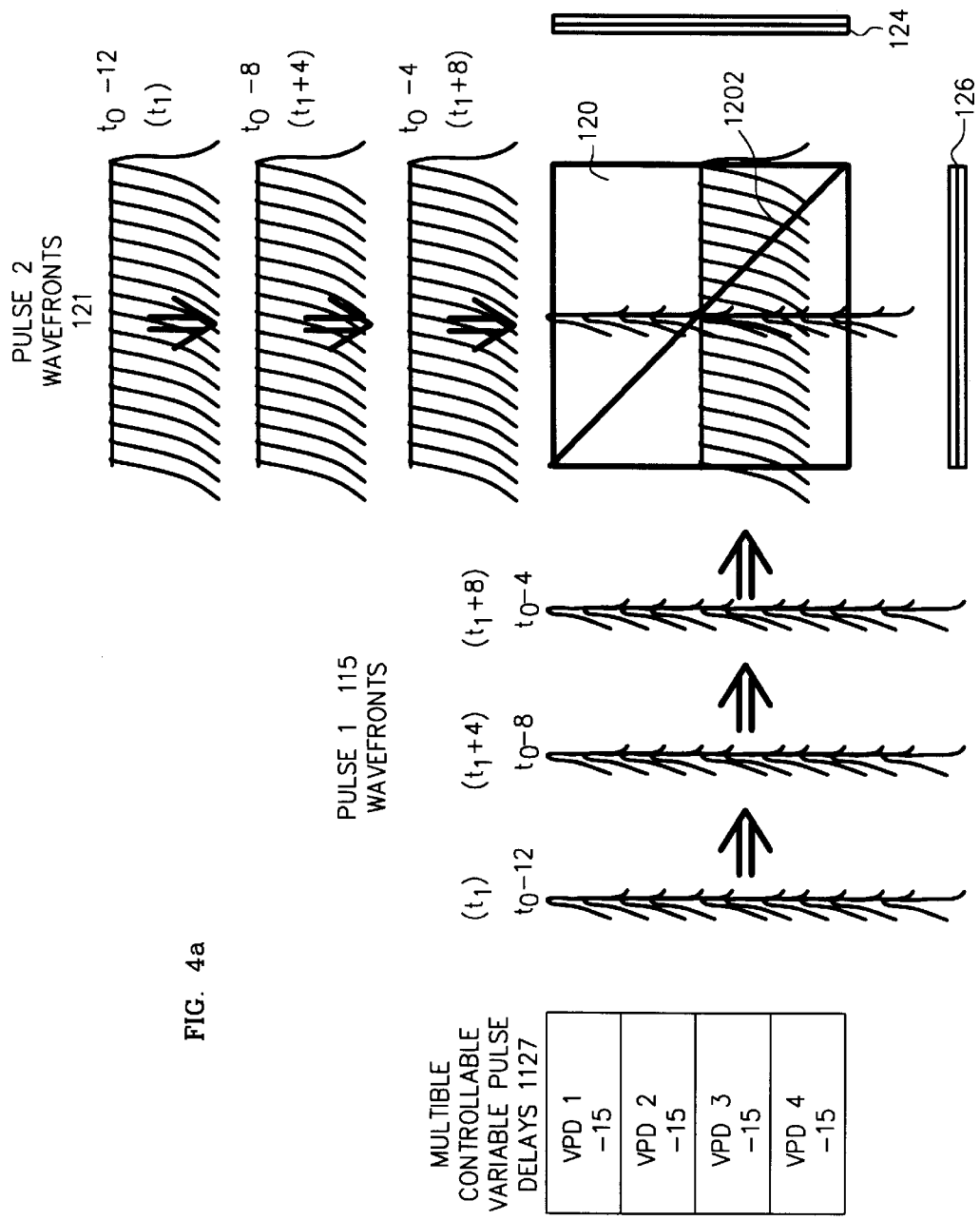
FIG. 4, consisting of FIG. 4a through FIG. 4d, illustrates the manner by which a one, first, plane wave radiation pulse passes unobstructed and un-delayed through a three-dimensional volume of radiation-sensitive medium; and by which another, second, plane wave radiation pulse simultaneously passes through the same volume of medium after being selectively controllably delayed in its spatial regions; so that the two radiation pulses interact with the radiation-sensitive medium (by process of two-photon absorption) in variously particularly selected domains thereof, which selected domains are thus addressed for any of the processes of writing, reading or erasing.
Figure 4B:
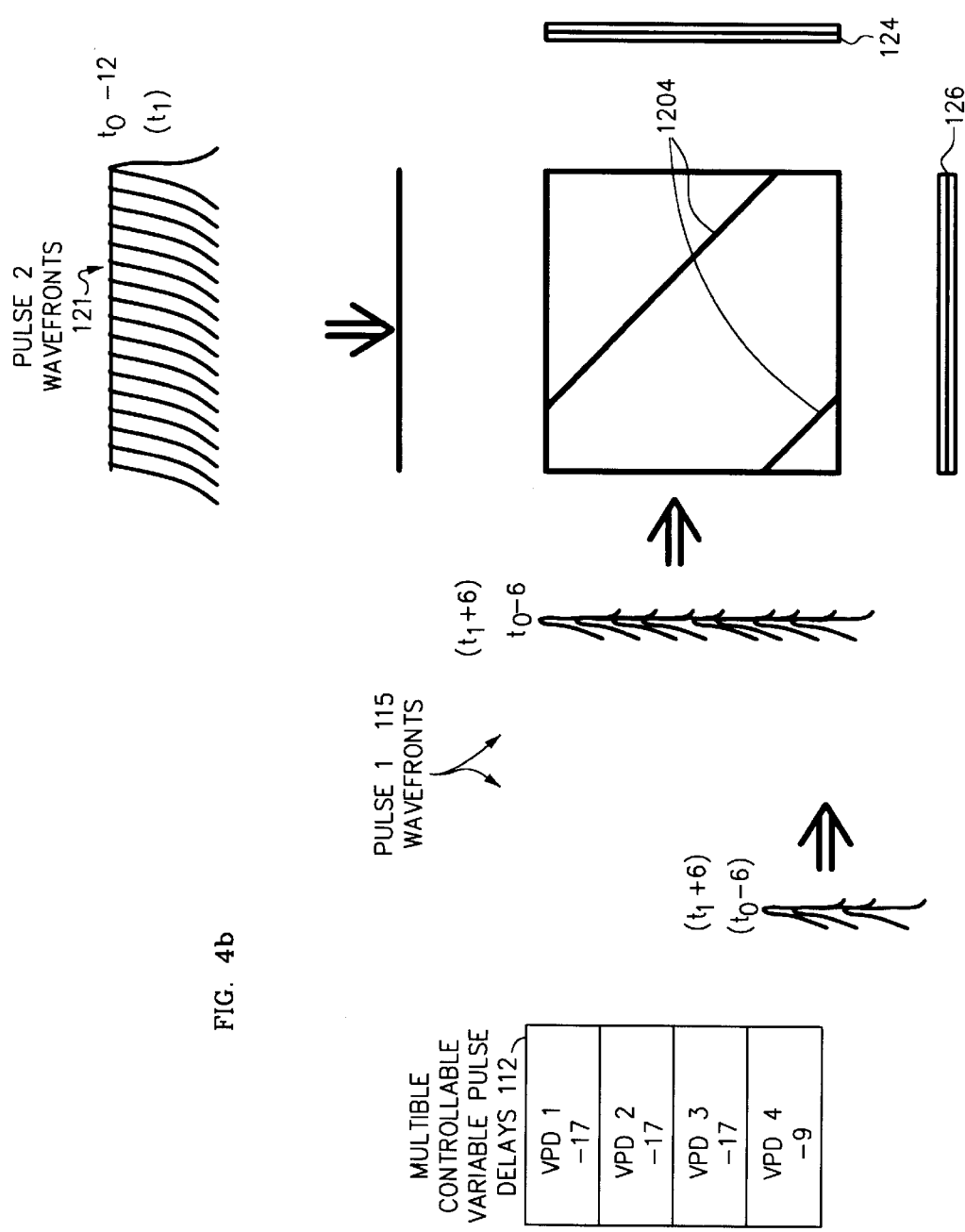
Figure 4C:
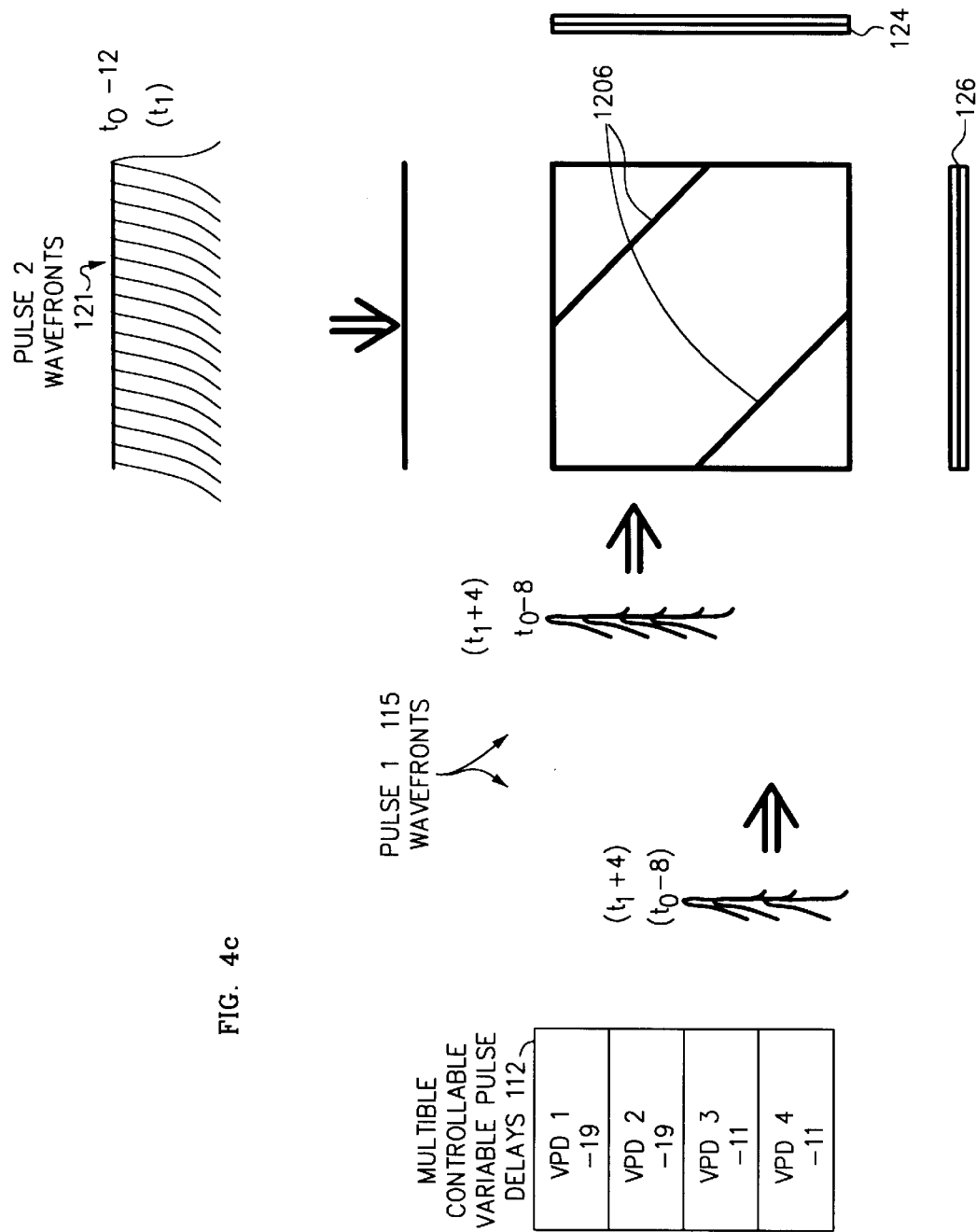
Figure 4D:
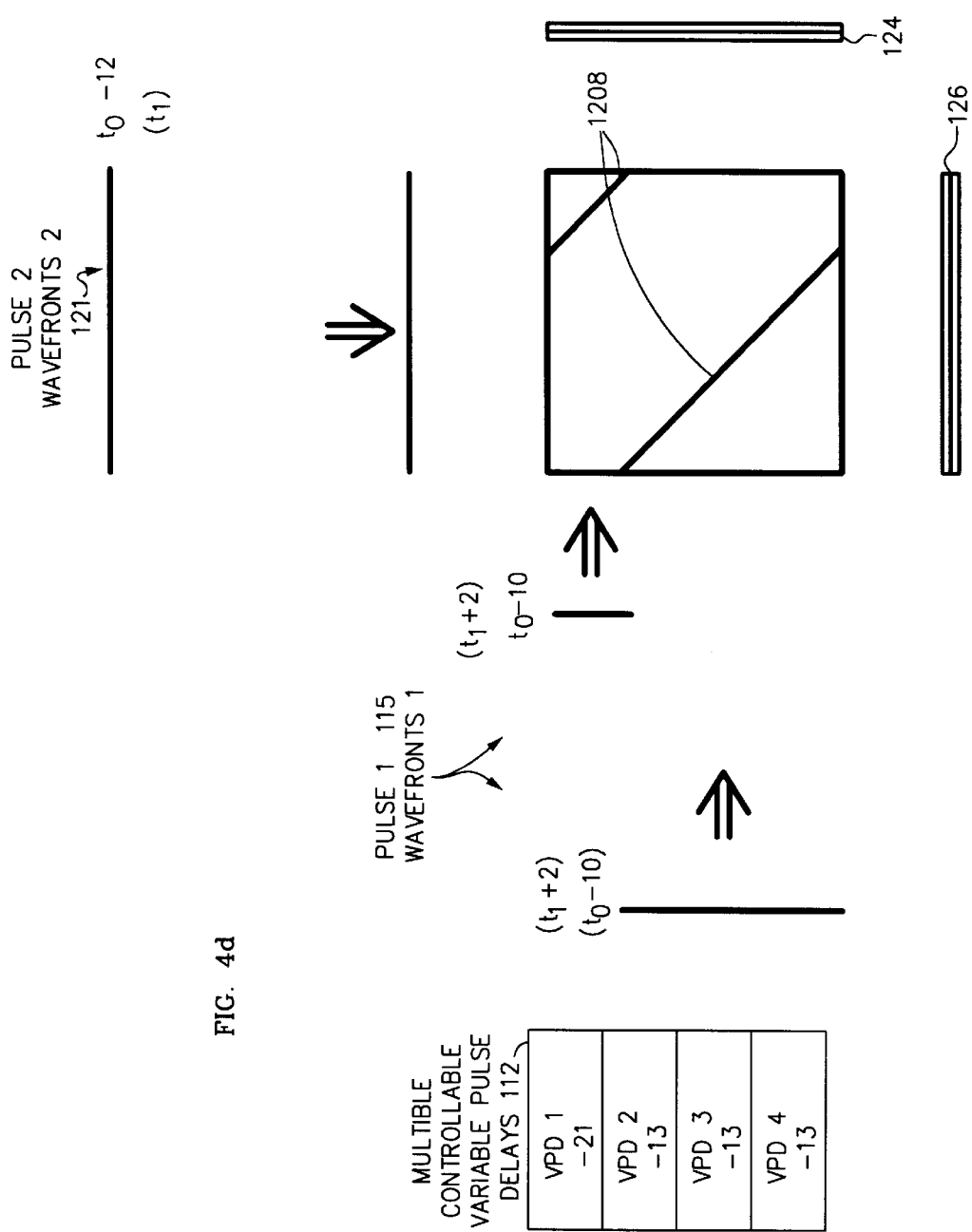

Consider now FIG. 4a. The VOLUME OF TWO-STATE, DUAL-DIFFRACTION-INDEX, PHOTOCHROMIC MEDIUM 120 is shown in plan view of a surface (a side) not receiving either the pulse 1 115 nor the pulse 2 121. The wavefronts of both the PULSE 1 115 and the PULSE 2 121 are illustrated as sharply peaked pulses, being that an infinite rise and fall time in the generation of these pulses is neither possible nor required (for their subsequent two-photon interaction). In FIG. 4a each and both PULSE 1 115 and PULSE 2 121, each of which is planar wavefront of light shown at three separate times in three separate positions advancing in the direction of the arrows, impinges flat against a respective side of the VOLUME OF TWO-STATE, DUAL-DIFFRACTION-INDEX, PHOTOCHROMIC MEDIUM 120 at the same time $t_o$, and propagates therethrough.

Slight deliberation will reveal that the intersection of the two propagating plane wave pulses 115, 121—each of which is illustrated at equal time half way in its passage through the MEDIUM 120—is the diagonal plane 1202. Each intersection region on this plane 1202 maps unambiguously, and uniquely, into a corresponding point on each of the detector arrays 124, 126. Some additional thought would reveal that if one pulse 115, 121 were to be delayed in arrival relative to the other then a minor diagonal plane of the MEDIUM 102 would form the locus of intersection points. Although this minor diagonal plane would map unambiguously, and uniquely, unto detector the arrays 124, 126, it would not contain the same full number of intersection points, or domains, as lie within the major plane 1202. Indeed, the locus of intersection points, or domains, would migrate with ever increasing delay to ultimately be but a line in a one corner of the cubical MEDIUM 120.

The FIGS. 4a–4d show, roughly and in quarter segments, the manner of addressing the VOLUME OF TWO-STATE, DUAL-DIFFRACTION-INDEX, PHOTOCHROMIC MEDIUM 120 with perpendicularly intersecting beams 115, 121. In each of FIGS. 4b–4c different regions of the wavefront of PULSE 1 115 are differently delayed. The timing, and the propagation, of PULSE 2 121 remains constant, and constant in all regions of the PULSE 2 121 wavefront. The locus of intersection points, or domains, are respectively shown as composite planes 1204 in FIG. 4a, composite planes 1206 in FIG. 4b and composite planes 1208 in FIG. 4c. Each set of composite planes 1204, 1206, 1208 has fully as many points, or domains, as are upon the primary intersection plane 1202 shown in FIG. 4a. Moreover, each point, or domain, on each of the composite intersection planes 1204, 1206 and 1208 maps on to one, and only one, uniquely corresponding point on the arrayed detectors 124, 126.

The showing of FIG. 4a through FIG. 4d is simply that the locus of intersection points within the VOLUME OF TWO-STATE, DUAL-DIFFRACTION-INDEX, PHOTOCHROMIC MEDIUM 120 (shown in FIGS. 1, 3 and 4) must be controlled so that each point maps to one and only one uniquely corresponding point on the arrayed detectors 124, 126 (shown in FIGS. 1, 3 and 4). Moreover, as all the great multiplicity of intersection points, or domains, that are within the VOLUME OF TWO-STATE, DUAL-DIFFRACTION-INDEX, PHOTOCHROMIC MEDIUM 120 are successively addressed, one multiplicity of domains at one time, then an equal, and full, number of domains will be addressed each time until ultimately, all domains may be addressed.

2.2 A Preferred, Counter-Propagating Pulse, Embodiment of a 2-P 4-D Radiation Memory in Accordance with the Present Invention A schematic of a second, preferred, embodiment 100 of a 2-P 4-D radiation memory in accordance with the present invention is shown in FIG. 3. The LASER 102, previously seen in the embodiment of FIG. 1, again produces a radiation pulse of an appropriate energy. The light radiation pulse is again split in a beam splitter BS 104 for distribution along each of two paths.

One of the two light pulses 105 optionally undergoes a frequency shift in FREQUENCY SHIFT 106 in response to READ/WRITE/ERASE CONTROL 107 in accordance whether the current operation is reading, writing or erasing.

Typically the same light pulse 105 that is shifted is also spatially encoded in its two-dimensional wavefront in the PAGE COMPOSER 110, and is temporally delayed in gross, and along its entire wavefront, in the VARIABLE PULSE DELAY 1120. The PAGE COMPOSER 110 may be, as is taught within the related companion patent applications, an array of spatial light modulators. The VARIABLE PULSE DELAY 1120 is typically an electro-optic or acousto-optic device.

In accordance with the principles of optics, the light pulse 105 is normally expanded before so encoding with DATA INPUT 111, and before delaying in accordance with ADDRESS 113, in a BEAM EXPANDER 108. After the light pulse 105 is (i) spatially encoded, and (ii) delayed, it is again typically scaled, again in accordance with the principles of optics, by a BEAM CONTRACTOR 114 so that it may be of appropriate size to the VOLUME OF TWO-STATE, DUAL-DIFFRACTION-INDEX, PHOTOCHROMIC MEDIUM 120.

The spatially-encoded and spatially-selectively-delayed light pulse 105 is steered by mirrors 116, 118 as prove necessary to impinge upon the VOLUME OF TWO-STATE, DUAL-DIFFRACTION-INDEX, PHOTOCHROMIC MEDIUM 120. The delayed condition of the wavefront of the light pulse 105 on its way to the VOLUME OF TWO-STATE, DUAL-DIFFRACTION-INDEX, PHOTOCHROMIC MEDIUM 120 is illustrated as, for example, the TYPICAL PULSE 1.

Likewise, the other light pulse 121 is also typically delayed in a FIXED PULSE DELAY 122 in order that it may be properly coincident with the light pulse 105 within the VOLUME OF TWO-STATE, DUAL-DIFFRACTION-INDEX, PHOTOCHROMIC MEDIUM 120. The delayed condition of the wavefront of the light pulse 121 on its way to the VOLUME OF TWO-STATE, DUAL-DIFFRACTION-INDEX, PHOTOCHROMIC MEDIUM 120 is illustrated as, for example, the TYPICAL PULSE 2.

The TYPICAL PULSE 1 passes through a BEAMSPLITTER 1 123 and impinges upon a face of the cubical VOLUME OF TWO-STATE, DUAL-DIFFRACTION-INDEX, PHOTOCHROMIC MEDIUM 120. Insofar as any energy is lost in the BEAMSPLITTER 1 123 (by a reflection path not shown), this energy can easily be replaced, or compensated for, by the LASER 102. Similarly, the TYPICAL PULSE 2 also passes through a BEAMSPLITTER 2 119 and then impinges upon the opposite face of the cubical VOLUME OF TWO-STATE, DUAL-DIFFRACTION-INDEX, PHOTOCHROMIC MEDIUM 120 to that face that is illuminated by the pulse 121.

The TYPICAL PULSE 1 and the TYPICAL PULSE 2 are spatially and temporally coincident at INTERSECTION DOMAINS (TYPICAL) 1220 within the VOLUME OF TWO-STATE, DUAL-DIFFRACTION-INDEX, PHOTOCHROMIC MEDIUM 120. These intersection domains are, in this preferred embodiment 100 of the 2-P 4-D radiation memory, located in a plane. The interaction of each, and or both, (delayed) pulses 105, 121 with the photochromic medium at these intersection regions is by process of two-photon interaction, and is governed by quantum mechanics.

The TYPICAL PULSE 1 as interacted with the intersection regions impinges, scaled if necessary by the use of lenses (not shown), upon the REDUNDANT DETECTOR 1 124, or Charge Coupled Device CCD 1. Likewise, the TYPICAL PULSE 2 as interacted with the same intersection regions impinges, again scaled if necessary by the use of lenses (not shown), upon the REDUNDANT DETECTOR 2 126, or Charge Coupled Device CCD 2. The data pattern that is impressed upon each pulse by and at the intersection domains will be read, and will be identical, at each of the detector arrays. The data developed at the detector arrays may be redundantly compared in order to detect any error, and is normally further transmitted to a computer or the like as DIGITAL DATA OUT 123.

Figure 5A:
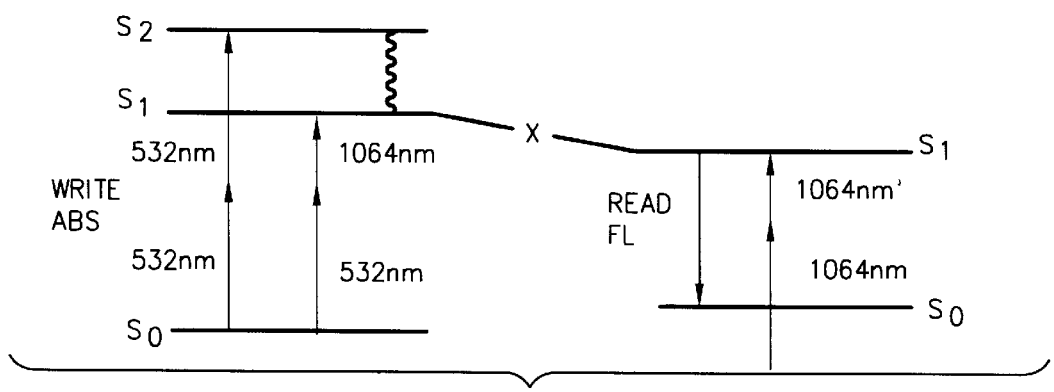
FIG. 5, consisting of FIG. 5a and FIG. 5b, is a schematic energy level diagram showing the "write" and "read" forms of a particular photochromic molecule preferred for use as the radiation-sensitive medium in the two-photon four-dimensional (2-P 4-D) radiation memory of the present invention: "X" is an intermediate to the isomerization of the spirobenzopyran (SP) molecules while the structures of the two forms of SP, and the preferred laser wavelengths used for writing and reading, are also shown.
Figure 5B:
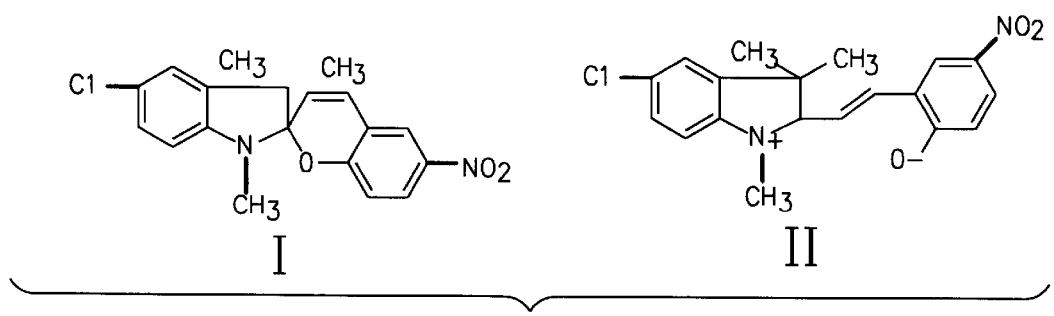

2.3 Particular Properties of the Preferred, Spirobenzopyran, Radiation-Sensitive Medium of the 2-P 4-D Radiation Memory in Accordance with the Present Invention FIG. 5a displays an energy level diagram and FIG. 5b shows the molecular structures of the "write" and "read" forms of the particular, preferred, spirobenzopyran, radiation-sensitive medium of the 2-P 4-D radiation memory in accordance with the present invention. By translating the beams along the axes of the sample, which can be cast in a form of a cube or any other form, the required spatial resolution is achieved in the form of colored spots throughout the cube. The information can be stored in a page format with several pages superimposed in the volume. A complication can arise from the presence of fluorescence from the excited spiroform which, if absorbed by adjacent molecules, would subsequently transform them to the written form and thus introduce cross-talk between adjacent bits. To avoid this, molecules that do not substantially fluoresce in the "write" form are preferred. Fluorescence from the "write" form of the spirobenzopyran has not been observed even at liquid nitrogen temperatures. Reference S. A. Krysanov and M. V. Alfimov, Chem. Phys. Lett., 91, 77 (1982).

The "read" cycle operates similarly to the writing cycle except that the "reading" form absorbs at longer wavelengths than the "write" form. Hence one or both laser beam wavelengths must be different than the ones used for writing. Only molecules that have previously been written will absorb this radiation and fluorescence will be emitted subsequently from this part of the memory.

On the other hand, if the molecule has not been "written" then fluorescence is not observed since the "read" two-photon wavelength cannot be absorbed as shown in FIG. 5a. Self-absorption of the fluorescence by spirobenzopyran molecules in adjacent positions that have been "written", does not affect the "reading" process because the largest part of the fluorescence is emitted at longer wavelengths and does not overlap the absorption band. Any fluorescence absorbed by any adjacent bits will yield signals which are either too weak to be detected or can be easily eliminated with electronic discriminators.

The erasure cycle is performed by increasing the temperature of the sample and/or by irradiation with infrared or visible light. By raising the temperature the molecules return to the original "write" form, the information is erased and the volume of medium is ready for storing new data. By bleaching the sample with light (i.e., infrared) the duration of the "erasure" cycle can be shortened considerably. A limitation of controlling the "erasure" cycle by temperature is that it is not possible to selectively "erase" part of the information stored in a 3-D memory unit. However, use of light for erasing circumvents this difficulty.

The stepwise absorption of two photons is equivalent to two successive one photon excitations. However, the two-photon excitation process which is employed for the 2-P 4-D radiation memory of the present invention corresponds to the simultaneous absorption of two photons by the molecule which undergoes a transition $E_i \rightarrow E_n$ where $E_n - E_i = h\nu = h\Sigma\nu_n$ where h is Plank's constant and $\nu$ is the frequency. As shown initially by M. Goeppert-Mayer in *Ann. Phys.* (Leipzig) [5], 9, 273 (1931), the two-photon transition probability $A_{in}$, from state i to state n is proportional to three terms. The first term is the product of the intensities $I_1 \times I_2$; the second term represents the spectral line profile. The second term includes the homogeneous line width $Y_{in}$, and corresponds to a large extent to a one-photon transition of a moving molecule at a center frequency $W_{in}$. The third term is derived by second order perturbation theory and gives the probability for the two-photon transition. $A_{in}$ is given by Y. Kalisky and D. J. Williams, in *Macromolecules*, 17, 292 (1984).

The characteristics of two-photon transitions are as follows: states of the same parity as the ground state can be accessed while one-photon transitions to these states are forbidden. The incident beams may have greatly separated energies, i.e., UV and IR. It is possible to eliminate momentum transfer between the incident beam and the molecule. It is possible to excite by two-photon processes states that cannot be accessed with one-photon processes and obtain high resolution spectra. However, for large molecules several vibronic levels are accessed simultaneously owing to the finite laser line width so that the parity requirement is relaxed.

In the preferred embodiment of a memory in accordance with the present invention a passively/actively mode-locked $Nd^{3+}$/YAG laser such as, typically, type Quantel YG501-20 emits 1064 nm, 20 ps pulses at a repetition rate of 20 Hz. The 1064 nm fundamental wavelength, the 5 32 nm second harmonic, the 355 nm third harmonic and the 266 nm fourth harmonic are used. The fundamental beam is circularly polarized, whereas the higher harmonics are linearly polarized.

Absorption spectra may be recorded on an absorption spectrophotometer, such as type Cary 219. The one-photon and two-photon induced fluorescence spectra are dispersed using a 0.25 m monochromator, and are detected by an intensified diode array coupled to a microcomputer. The time-resolved spectra are obtained with a streak camera coupled to an intensified diode array which is connected to a microcomputer. When needed a 150 watt Xenon lamp provides steady state UV irradiation of the sample.

The molecule 5'-chloro-6-nitro-1',3',3'-trimethyl-spiro-[2H-1-benzopyran-2,2'-indoline], SP, (Chroma Chemicals) was purified by recrystallization from methanol and benzene. The polymer hosts polystyrene, PSt, (Aldrich), polymethylmethacrylate, PMMA, (Aldrich), polyethyleneglycol, PEtG, (Sigma), as well as the solvents methanol (HPLC grade, Fisher), chloroform (HPLC grade, Fisher), dichloroethane (HPLC grade, Aldrich) were used without further purification.

Thin polymer films (100 $\mu$m) containing 1% SP by weight were prepared on a glass slide by solvent casting from a dichloroethane solution which contained 30% PSt by weight, or from a chloroform solution containing either 30% PMMA by weight, or 30% PEtG by weight. All films were placed in a vacuum for several hours to ascertain complete evaporation of the solvent.

Figure 6:
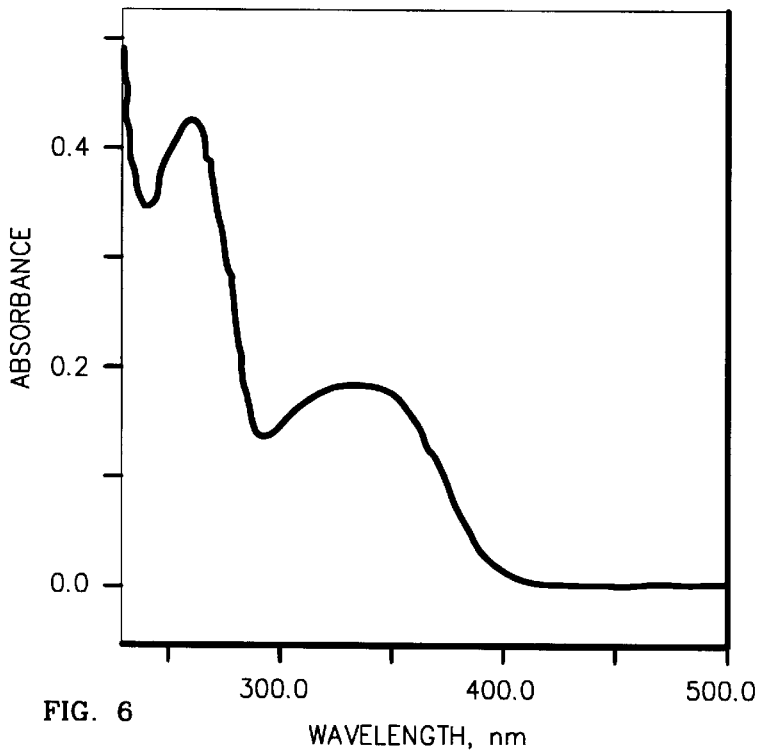
FIG. 6 is a graph showing room temperature UV absorption spectrum of SP in a 30% PEtG/CHCl$_3$ solution before irradiation wherein (i) absorption is not observed above 400 nm, (ii) SP weight is 1% relative to the weight of the polymer, and (iii) path length=2 mm.

FIG. 6 shows the UV absorption spectrum of SP in a polyethylene glycol/chloroform solution. The salient features of the spectrum are the two bands, one centered at approximately 325 nm and the other at approximately 260 nm. It is observed that the molecule shows considerable absorption at both 355 nm and 266 nm albeit the first is approximately 2–3 times weaker. Thus SP is appropriate for two photon absorption studies by a combination of the fundamental and the higher harmonics of the $Nd^{3+}$/YAG laser.

Figure 7:
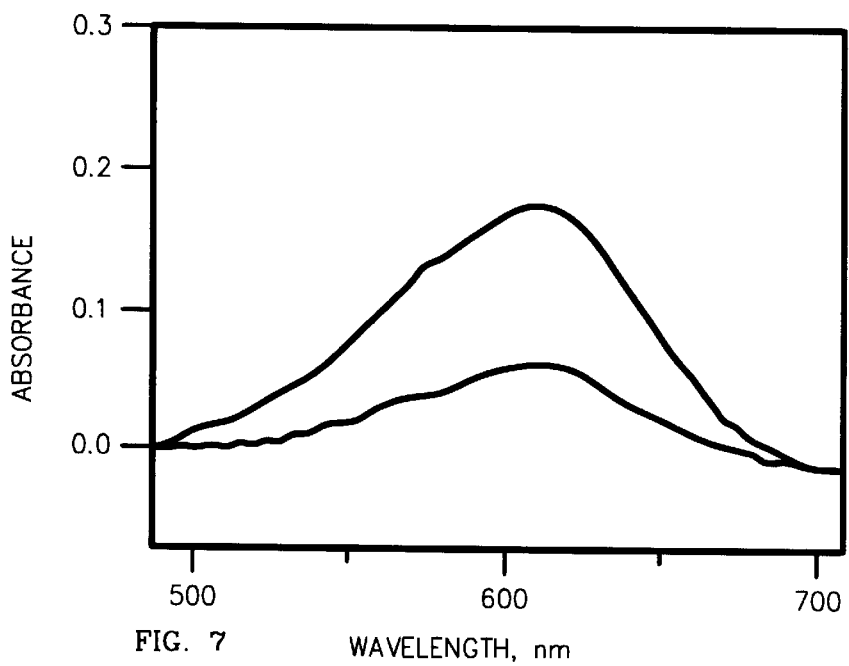
FIG. 7 is a graph showing room temperature visible absorption spectrum of 1% SP in a PSt film both (i) after irradiation for 5 sec with 355 nm, pulse fluence 4 mJ/cm$^2$, and (ii) after irradiation for 60 sec with 532 nm and 1064 nm, total pulse fluence being 20 mJ/cm$^2$, wherein in both cases beam d=1 cm.

FIG. 7 shows the room temperature visible absorption spectrum of SP in PSt. After irradiation in the UV a new absorption band in the red region of the visible spectrum is observed. In FIG. 7 the absorption spectrum of the two-photon excited SP is also shown which is identical, as expected, to the one photon spectrum. The two-photon photochromism is induced by spatially and temporally overlapping the 532 nm beam with the 1064 nm beam of the $Nd^{3+}$/YAG laser. The sum of the energies of the two photons equals the energy of the transition which occurs at 355 nm. When the film is irradiated with only the 532 nm beam or the 1064 nm beam photochromism is not observed.

It is obvious that the two-photon method puts a stringent requirement on the simultaneous arrival of the two pulses since the intermediate virtual state has essentially no lifetime. Reference P. M. Rentzepis, Chem. Phys. Lett., 2, 117 (1968). The process is in effect dependent upon the square of the laser peak power, hence short pulses (i.e., picosecond) are preferable owing to their inherent high peak power. Because the PSt matrix shows a strong absorption at 266 nm, photochromism induced by two 532 nm PSt matrix shows a strong absorption at 266 nm, the fact that photochromism induced by two 532 nm photons from SP in PSt is not observed is most probably due to quenching.

Figure 8:
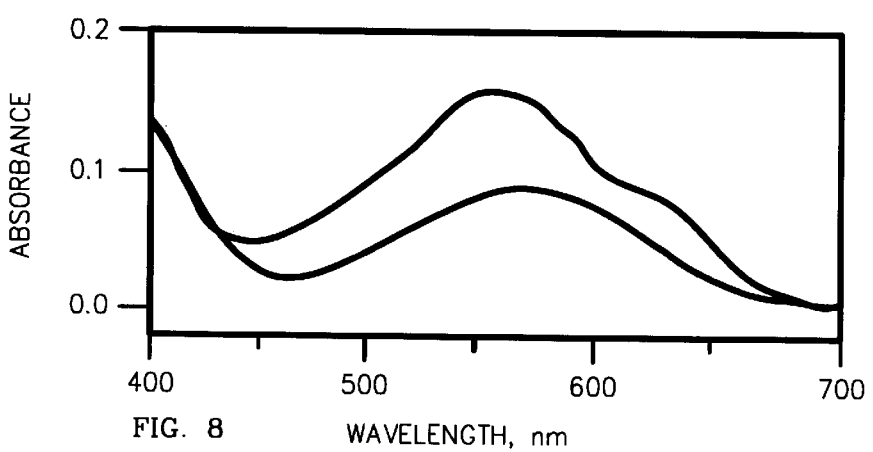
FIG. 8 is a graph showing the absorption spectrum of 1% SP in a PEtG film after being placed in dry ice and allowed subsequently to warm up to room temperature both (i) after excitation for 5 sec with 266 nm light with a pulse fluence equalling 2 mJ/cm$^2$ and (ii) after excitation for 60 sec with 532 nm light with a pulse fluence equalling 5 mJ/cm$^2$, both with a beam d=1 cm.

FIG. 8 shows the absorption spectra of SP in PEtG when isomerized via one-photon and two-photon excitation. These films were placed in dry ice and a change in color was observed from violet to blue. This change in color results from the shoulder of the absorption band between 600 and 650 nm. The films were allowed to warm up at room temperature for a few minutes before the absorption spectra, shown in FIG. 8, were taken. The absorption shoulder at approximately 625 nm persists for several minutes at room temperature, and for several months or longer at −78° C.

The appearance of different colored forms at different temperatures has been attributed to equilibrium between various colored species. Reference R. C. Bertelson, in *Techniques of Chemistry: Photochromism,* vol. 3, ed G. M. Brown, Wiley-Interscience, New York, 1971, p. 45. In the polymer matrix aggregation is favored; in addition at low temperatures aggregation is enhanced. The spectral position of the shoulder is very similar to the absorption maximum of the merocyanine form of SP in PSt. In the less polar PSt matrix aggregation is expected to be favored, therefore this new absorption shoulder can be attributed to aggregate formation. In PMMA the absorption of the merocyanine form is also blue shifted relative to PSt. However when the PMMA films are placed in dry ice (−78° C.), a color change is not observed. It is possible that the more polar PMMA prevents aggregation from occurring even at dry ice temperatures.

FIG. 8 also shows the absorption spectrum of a PEtG film of SP which has been excited by two photons of 532 nm. Since the PEtG host polymer does not absorb at 266 nm and the absorption cross section of SP at 266 nm is higher than the absorption cross section at 355 nm, the two-photon absorption was readily observed in this system. This allows a decrease in the required beam intensity, which lowers the possibility of photochemical decomposition of the sample. The absorption spectrum of the merocyanine form of SP is blue shifted in the more polar PEtG matrix relative to the absorption spectrum in PSt. This indicates a n-→$\pi$* transition to the first excited state and a larger ground state dipole moment.

The fluorescence of the merocyanine form of the spirobenzopyrans has received less attention than the parent form, although merocyanine fluorescence has also been observed previously. Reference P. S. Becker and J. K. Roy, *J. Phys. Chem.,* 69, 1435 (1965); A. V. Shablya, K. B. Demidov and Yu. N. Polyakov, *Opt. Spectry,* 20, 412 (1966); and K. Horie et al., *Chem. Phys. Lett.,* 119, 199 (1985).

Figure 9:
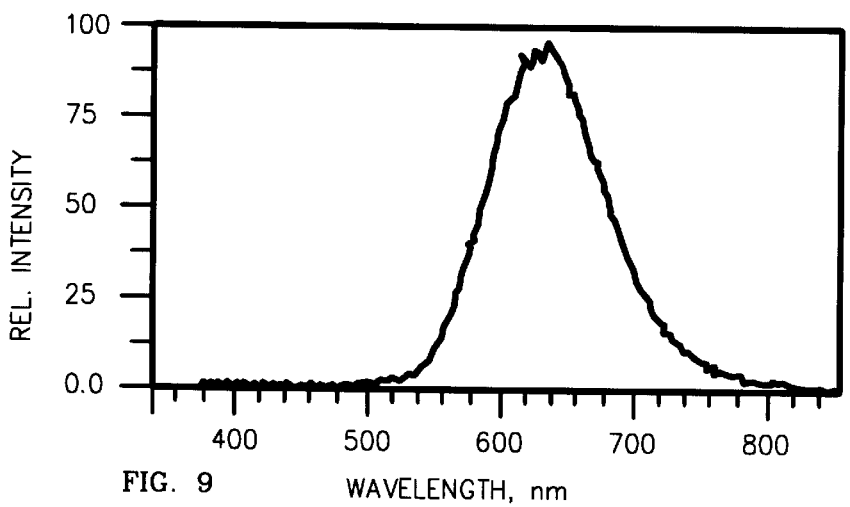
FIG. 9 is a graph showing room temperature fluorescence spectrum of the merocyanine form of 1% SP in PMMA with an excitation wavelength of 532 nm, a pulse fluence of 0.1 mJ/cm$^2$, and a beam d=2 mm.
Figure 10:
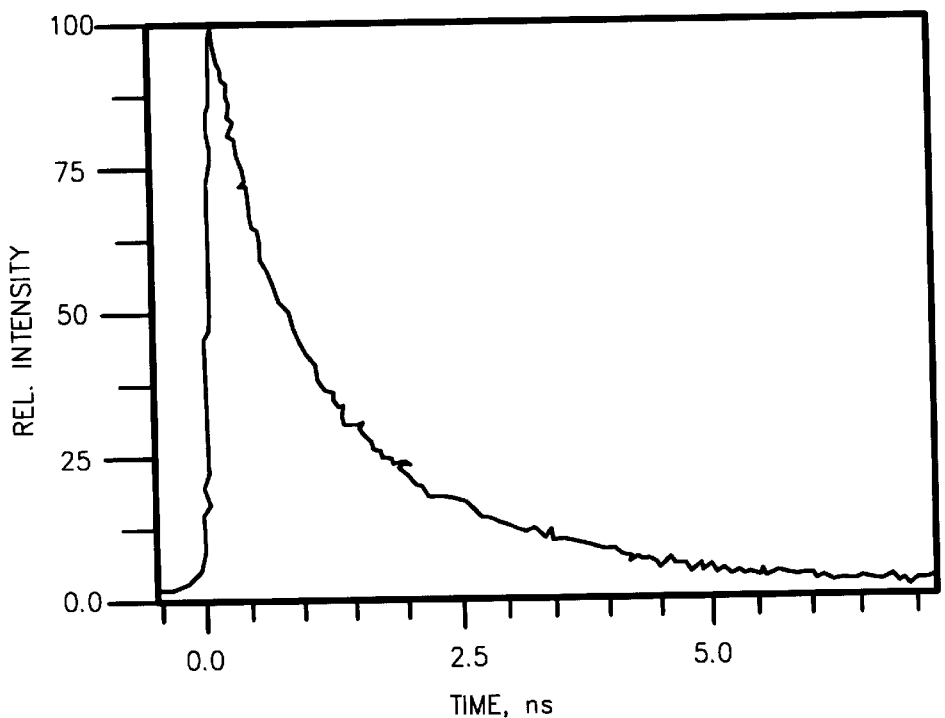
FIG. 10 is a graph showing the decay of the merocyanine fluorescence of 1% SP in EPtG, monitored at 600 nm where excitation equals 532 nm, pulse fluence equals 0.1 mJ/cm$^2$, and beam d=2 mm.

The one-photon induced fluorescence spectrum of the merocyanine form of SP in PMMA is shown in FIG. 9. The fluorescence of SP in PEtG exhibits at least a biexponential decay as shown in FIG. 10. The lifetimes of the merocyanine fluorescence of SP in solution and in various matrices are summarized in the following Table 2 where it is shown also that the fluorescence exhibits at least biexponential decays.

TABLE 2

Lifetimes of SP Fluorescence in Solution and in
Polymer Matrices Monitored at 600 nm.
Lifetime uncertainty is ±10%

| Solvent/<br>Matrix | Concentration<br>or % weight | $t_1$,<br>amplitude<br>(ps) | $t_2$,<br>amplitude<br>(ps) |
|---|---|---|---|
| Methanol | $2.9 \times 10^{-5}$M | 40, 0.75 | 300, 0.25 |
| PMMA | 1% | 1300, 0.60 | 3300, 0.40 |
| PEtG | 1% | 600, 0.62 | 2500, 0.38 |
| PSt | 1% | 1800, 0.60 | 4000, 0.40 |

This biexponential decay implies that the merocyanine molecules in the polymer films and in solution exist in various forms. The presence of various aggregates in addition to the monomer is very probable considering the high concentration of SP in the films. The decay of the merocyanine form to the original spiropyran form has been shown to be concentration dependent suggesting the existence of various aggregate forms. Reference H. Eckhardt, A. Bose and V. A. Krongauz, Polymer, 28, 1959 (1987). The fluorescence lifetime is shown to be shorter in solution than in the polymer matrices. This may be attributed to viscosity effects in the rigid polymer matrices, in addition to the influence of the free volume in each matrix. Further, the polar properties of the matrices used influence the degree of aggregation so that analysis of the observed biexponential decays based on simple model is not feasible. Lifetime values of a different spirobenzopyran molecule have been reported by Horie et al. (cited previously). However, these authors report a single lifetime. Since the molecule studies and the concentrations are different, such discrepancies may be expected.

Figure 11:
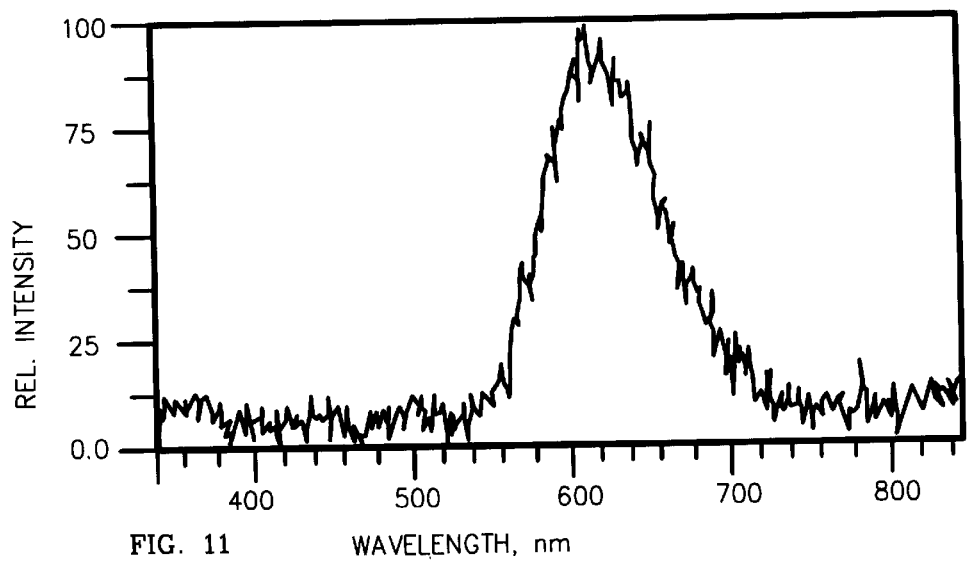
FIG. 11 is a graph showing room temperature two-photon induced fluorescence spectra of the colored merocyanine form of 1% SP in a) PMMA and b) PEtG where the excitation wavelength equals 1064 nm, the pulse fluence equals 1.5 mJ/cm$^2$, and the beam d=2 mm.
Figure 12:
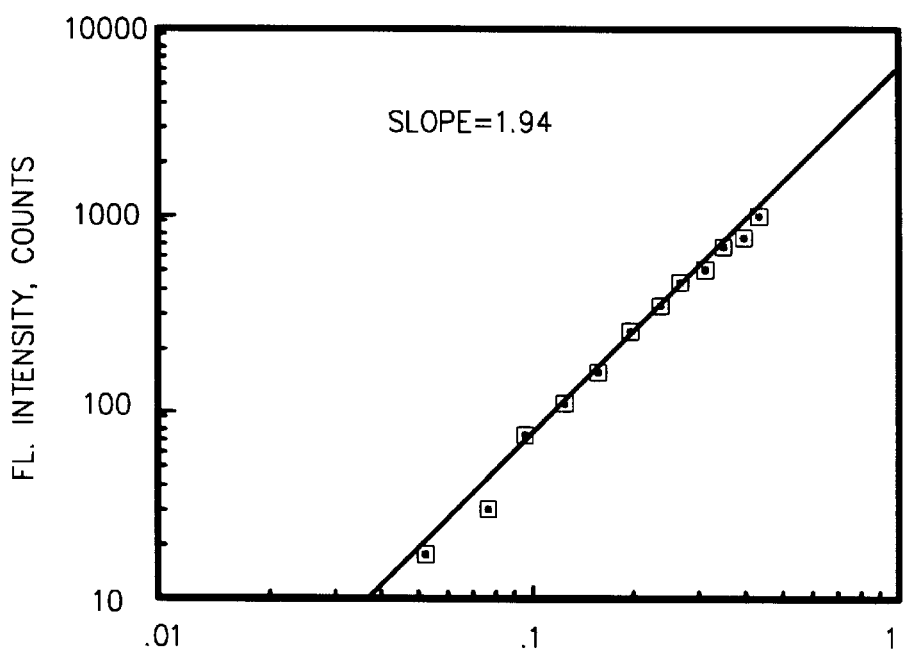
FIG. 12 is a log-log plot of the fluorescence intensity versus the excitation pulse energy of two-photon induced fluorescence; a slope of 2 within experimental error is observed (correlation equal to 0.992).

The spectra of the two-photon induced fluorescence of the merocyanine form of SP in PMMA and in PEtG films are shown in FIG. 11. The two-photon induced fluorescence spectrum was found to be identical to the one photon spectrum. The two-photon fluorescence was induced by two photons of 1064 nm which corresponds to a transition at 532 nm. The absorption spectrum of the merocyanine form of SP in PMMA shows an absorbance at 532 nm, which is approximately 70% of the absorption maximum located at approximately 560 nm. Since the absorption spectrum of the merocyanine form of SP in PSt is red shifted relative to the absorption spectrum in PMMA (discussed hereinafter) the two-photon induced fluorescence of the merocyanine form of SP in PSt is not observed owing to minimal absorbance at 532 nm. The energy dependence of the two-photon induced fluorescence intensity of SP in PMMA is presented in FIG. 12. As expected for a two-photon process, a square excitation intensity dependence of the two-photon induced fluorescence intensity is observed. The maximum energy of the beam was kept below the level where stimulated Raman processes and saturation effects occur.

Figure 13:
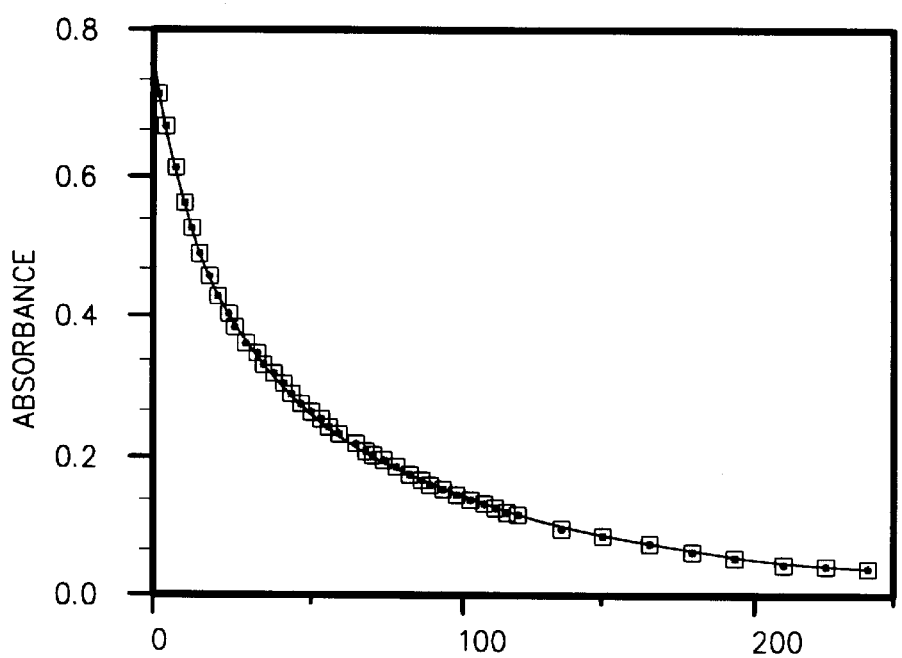
FIG. 13 is a graph of the decay of the colored merocyanine form of 1% SP in PMMA at room temperature (24° C.).

The decay (fading) of the ground state colored merocyanine form (written form) of SP in PMMA at room temperature is displayed in FIG. 13. A biexponential decay of this colored form is observed with $k_1=0.00173$ sec$^{-1}$ and $k_2=0.00024$ sec$^{-1}$ and amplitudes 0.2365 for $k_1$ and 0.489 for $k_2$. This biexponential decay is in reasonable agreement with results presented by Eckhardt, et al. (previously cited). In PEtG and in PSt however the decay constants are one to two orders of magnitude larger than in PMMA therefore the colored form fades much faster. Several studies on the fading rates of the colored merocyanine form of spirobenzopyrans indicate that the fading rates are dependent on the distribution of the free volume in the polymer matrices. Reference G. Smets, Adv. Polym. Sci., 50, 17 (1983). In addition, the fading rates are strongly concentration dependent, owing to the presence of different aggregates. The previously cited reference of Eckhardt, et al., may again be consulted. Although the concentration of SP in the various matrices was kept the same, differences in the fading rates still persist owing to the varying polarity of the matrices. Several films of SP in PMMA kept at −78° C. maintained the violet color of the merocyanine (written) form of SP for several weeks.

3. Utility of a 2-P 4-D Radiation Memory in Accordance with the Present Invention Sequential computers are approaching a fundamental physical limit on their computational power. Reference A. L. DeCegama, "Parallel Processing Architecture and VLSI Hardware," Prentice Hall, Inc. (1989). To achieve higher performance, computers are increasingly relying on parallel processing. Parallel processing computers require memory systems with high capacity and fast parallel access. Reference B. Robinson, "Grand Challenges to Supercomputing," Electronic Engineering Times, Sep. 18, 1989; R. H. Ewald and W. J. Worlton, "A Review of Supercomputer Installations' Mass Storage Requirements," IEEE Symposium on Mass Storage Systems, 33 (1985).

Present memory technologies such as semiconductor memories (see, for example, H. E. Maes, G. Groeseneken, H. Lebon, and J. Witters, "Trends in Semiconductor Memories," Microelectronics Journal, 20 nos. 1–2, 9–57 (1989)), optical disks (see, for example, W. P. Altman, G. M. Claffie, and M. L. Levene, "Optical Storage for High Performance Applications in the Late 1980s and Beyond," RCA Engineer (1986)), rigid and flexible magnetic disks (see, for example, A. E. Bell, "Critical Issues in High-Density Magnetic and Optical Data Storage: Part 1," Laser Focus 19, 61 (1983)), and magnetic tape each store information across a planar surface. Due to their two-dimensional nature, these storage devices are not able to provide parallel access. In addition, their access time grows with increasing capacity. The usage of memory devices based on these technologies in parallel computers can lead to an unbalanced situation where the cost, volume and power requirements of the memory device greatly exceed that of the processors. Reference K. R. Wallgren, "Optical Disks and Supercomputers," Proceedings of SPIE 529, 212 (1985).

To overcome the restrictions imposed by the present memory devices, research has been directed to identifying alternate means for information storage, including three-dimensional (3-D) optical memory devices. Reference D. Chen and J. D. Zook, "An Overview of Optical Data Storage Technology," Proceedings of the IEEE 63, 1207 (1975). 3-D optical memory devices have higher theoretical storage capacity than memory devices based on alternative technologies because information is stored in volume. For example, the maximum theoretical storage density for an optical disk is $P_{2-D}=1/l^2=3.5\times10^8$ bits/cm$^2$ assuming that 0.5 $\mu$m wavelength of light is used to access the information. On the other hand, assuming the same wavelength of light, the maximum theoretical storage density of a 3-D optical memory $P_{3-D}=1/l^3=6.5\times10^{12}$ bits/cm$^3$. In addition, 3-D optical memory devices have the potential for parallel access, because an entire bit plane can be read or written in a single memory access operation. However, the difficulty of addressing the individual memory bits without data interaction and crosstalk with other bits has previously obstructed the development of 3-D optical memory devices.

Various schemes have been proposed for 3-D optical memories. For example, the photorefractive effect for holographic storage (see, for example, J. E. Weaver and T. K. Gaylord, "Evaluation Experiments on Holographic Storage of Binary Data in Electro-Optic Crystals," Optical Engineering 20, 404 (1981)), spectral hole burning (see, for example, U. P. Wild, S. E. Bucher, and F. A. Burkhalter, "Hole Burning, Stark Effect, and Data Storage," Applied Optics 24, 1526 (1985)), and optical echo (see, for example, L. d'Auria, J. P. Huignard, C. Slezak, and Spitz, Experimental Holographic Read-Write Memory Using 3-D Storage," Applied Optics 13, 808 (1974)) have each been proposed. However, the two-photon interaction effect employed in the present invention (see, for example, N. W. Carlson, L. J. Rothberg, and A. G. Yodh, "Storage and Time Reversal of Light Pulses Using Photon Echoes," Optics Letters 8, 483 (1983); Multiphoton Processes, P. Lambropoulos and S. J. Smith, Eds. (Springer-Verlag Berlin Heidelberg) (1984)), provides a means of storing and reading data into separate selected bit locations throughout the entire volume without effecting neighboring bit locations. In addition, the two-photon absorption process has the benefits of high sensitivity, high speed, and an ability to work near room temperature. The volume optical memory in accordance with the present invention that is based on the two-photon absorption effect can achieve a very high capacity, as well as a parallel access of typically $4 \times 10^6$ bits per memory read/write cycle operation. Finally, the volume optical memory in accordance with the present invention based on two-photon interaction/absorption has a low cost per bit because the storage medium that it uses is typically an inexpensive polymer.

4. General Principles of Two-Photon Interaction

This section reviews the general nature of the two-photon interaction process, and a preferred effect thereof, and discusses how such process and preferred effect can be used in an optical volume memory device because of its unique support of (spatially and temporally) concurred addressing. Experimental data is presented on the "read" and "write" cycle of spirobenzopyran, a preferred radiation-sensitive medium.

2.1 Two-photon Absorption and its Relevance to Memory Functions

Two-photon interaction refers to the interaction that each of two photons may have with each other, and with any photonically-sensitive material present at the site of the interaction. Two-photon absorption is one type of two-photon interaction, and specifically refers to the excitation of a molecule to a state of higher energy by the simultaneous absorption of two photons. The first photon excites the molecule to a virtual state, while the second photon further excites the molecule to a real excited state. Since the intermediate state is a virtual state, the two-photon process is different from a biphotonic process where a real intermediate state is present. Reference R. M. MacFarlane, Journal of Lumin. 38, 20 (1987).

The wavelength of the two concurrent photon pulses (or beams) is such that although neither of the pulses is absorbed individually, the combination of the two wavelengths is in resonance with a molecular transition. Therefore both pulses (or beams) must overlap both temporally and spatially in order for two-photon absorption to result.

As diagrammatically shown in FIGS. 1 and 2, two photon pulses, of equal or different frequencies, energies and wavelengths, are directed along different directions in order to select any region inside of a volume of radiation-sensitive medium, and to interact with the radiation-sensitive medium as a function of both pulses combined at this selected region only. Each pulse may (or may not) interact with the radiation-sensitive medium outside the intersection volume (as defined in space and in time). But it is only at the intersection volume that both pulses will interact with the radiation-sensitive medium as, in accordance with and to the limits of the quantum-mechanical equations of tow-photon interaction, one pulse.

Because the pulses are (i) short and (ii) directional, satisfaction of the quantum mechanical equations of the two-photon process is localized to occur only at relatively small regions of temporal and spatial overlap between both pulses. The localization of regions of controlled volume, called the "addressing" of "domains", permits many separate domains in a three-dimensional volume to be individually addressably selected. Depending on the wavelengths of the two beams that are incident on the material, each addressed location can be either "written" or "read" as is discussed in the next section. In addition, since the two-photon absorption in the preferred radiation-sensitive medium—spirobenzopyran—is based on molecular transitions, the radiation-sensitive medium and the 2-P 4-D memory based thereon is able to operate in the picosecond regime. Finally, the small size of the molecules and of the radiation-sensitive medium low crosstalk between neighboring bits theoretically permits a domain size that is determined only by the optical diffraction limit of approximately 1 $\mu$m.

4.1 Materials Feasibility for Two-Photon Interaction

A prototype photochromic molecule has been used to demonstrate a 3-D optical memory based on two-photon processes. Reference the predecessor related patent application of inventor P. M. Rentzepis, U.S. Ser. No. 07/342,978) (1989), the contents of which are incorporated herein by reference. The photochromic molecule, a spirobenzopyran (see, for example, R. C. Bertelson, Techniques of Chemistry: Photochromism, vol. 3, G. M. Brown, Ed. (Wiley-Interscience, New York), 45 (1971)), initially absorbs only in the ultraviolet region; upon excitation it undergoes isomeric structural changes and it subsequently absorbs in the visible region also.

A schematic energy level diagram of spirobenzopyran was shown in FIG. 5a, and the two isomeric molecular forms was diagrammed in FIG. 5b, already discussed. The spirobenzopyran, embedded in a polymer matrix in the form of a 100 nm film, was irradiated simultaneously with two beams of 30 ps duration pulses having wavelengths of 532 nm and 1064 nm. Each beam had a total energy density less than 10 Nj/$\mu$m$^2$. Although the spirobenzopyran does not absorb visible or near infrared energy from either beam individually, two-photon absorption resulting from the temporal and spatial coincidence of both beams resulted in a coloration of the film. The absorption spectrum of the "written," colored, spirobenzopyran molecule is shown in FIG. 6, already discussed.

The "read" process of a 2-P 4-D radiation memory in accordance with the present invention is based on two-photon interaction, and two-photon absorption, of laser light. The "written" form of the spirobenzopyran molecule is excited with two beams each of 1064 nm wavelength laser light. A two-photon absorption of these infrared wavelength photons results in the emission of fluorescence from the "written" form of the radiation-sensitive medium. The two-photon induced fluorescence spectrum of the "written" form of spirobenzopyran was shown in FIG. 7, already discussed. The intensity of the observed fluorescence shows a square dependence on the excitation pulse energy, as was shown in FIG. 8, also already discussed. This dependence unequivocally demonstrates the two-photon nature of the process.

Thus the "read" cycle, which can be as fast as few tens of picoseconds, is also based on a two-photon interaction process. The reading, as well as writing, is of three-dimensionally stored information. Because the "read" cycle is based on changes in the index of refraction, a high sensitivity is obtained. The "written" form of the active, spirobenzopyran, medium persists at room temperature for several minutes. When the "written" form is placed in dry ice then it persists for several days. A complete discussion of the experimental results based on a spirobenzopyran molecule is presented by D. A. Parthenopoulos and P. M. Rentzepis in the article "Three dimensional optical storage memory" appearing in Science, 245, 843 (1989).

5. Comparison and Application of the 2-P 4-D Radiation Memory

This section compares the performance of the 2-P 4-D Radiation Memory with the performance of existing memory devices, and describes potential applications of memory in parallel computers. The proposed 2-P 4-D radiation memory can already be effectively used in present parallel computers. Its current performance (or better) will likely be required for the success of future optoelectronic and 3-D VLSI parallel computers.

4.1 Comparison of the 2-P 4-D Radiation Memory with Present Memory Technologies The performance of the 2-P 4-D Radiation Memory of the present invention is believed to provide the highest storage density and the largest parallelism (bandwidth) of any existing memory device. Existing memory devices are projected to increase in their storage capacity, but their bandwidth is expected to grow at a very slow rate. Thus the parallel access capability of the 2-P 4-D Radiation Memory will not likely be replicated by any existing memory device.

The access time of the 2-P 4-D Radiation Memory in accordance with the present invention is presently intermediary between the access times of semiconductor memory and magnetic disk devices. Therefore, with a low cost per megabyte, 2-P 4-D Radiation Memory can potentially become a more cost-effective mass storage technology than either magnetic or optical disks.

5.1 Potential Applications of the 2-P 4-D Radiation Memory

The 2-P 4-D Radiation Memory of the present invention has potential uses in existing and future parallel computers. The bandwidth of the 2-P 4-D Radiation Memory either exceeds or meets the bandwidth requirements of both existing and future parallel computers. On the other hand, the data transfer rates of existing memory devices are far below the required bandwidth, thus requiring the use of many of these devices in parallel to achieve higher bandwidth.

In existing supercomputers and hypercube parallel supercomputers (see, for example, IEEE Scientific Supercomputer Subcommittee, "Special Report on Supercomputing," Computer 22 no. 11, 57–68 (1989)), the 2-P 4-D Radiation Memory can be used as a cost-effective replacement for magnetic and optical disks as a secondary storage system. In addition, the potential removability of volume memory media makes it well suited for off-line storage. Applications are envisioned where the parallel access capability of the memory is used to gather data from 2-D image sensors, and is subsequently loaded into a supercomputer for processing at a slower rate.

In SIMD array processors (see, for example, L. W. Tucker and G. G. Robertson, "Architecture and Applications of the Connection Machine," Computer, Vol. 21 No. 8, 26–38 (1988); C. G. Winckless, "Massively Parallel Computer for Signal and Image Processing," Proceedings for the 1989 IEEE International Symposium on Circuits and Systems, Portland, Oreg., pp. 1396–1399 (May 8–11, 1989); R. A. Heaton and D. W. Blevins, "BLITZEN: A VLSI Array Processing Chip," Proceedings for the 1989 IEEE Custom Integrated Circuits Conference Proceedings, San Diego, Calif. (1989), pp. 12.1.1–12.1.5) the 2-P 4-D Radiation Memory can potentially be used as the main memory. Since these computers operate on bit planes of information synchronously, their memory access pattern fits the access pattern for the 2-P 4-D Radiation Memory. Also, since array processors use inexpensive VLSI processing elements, the potential low cost per megabyte of the 2-P 3-D Radiation Memory makes it very attractive for usage in these computers.

In the future, there will likely be massively parallel computers based on 3-D VLSI (see, for example, M. J. Little and J. Grinberg, "The Third Dimension," Byte, Vol. 13, No. 11, pp. 311–319 (November 1988); Yiochi Akasaka, "Three-dimensional Integrated Circuit: Technology and Application Prospect," Microelectronics Journal, 20 nos. 1–2, 105–112 (1989)) or optoelectronics technologies (see, for example, F. Kiamilev, S. Esener, R. Paturi, Y. Fainman, P. Mercier, C. C. Guest, and S. H. Lee, "Programmable Optoelectronic multiprocessors and Their Comparison with Symbolic Substitution for Digital Optical Computing," Optical Engineering 28, 296 (1989)). For these systems, the 2-P 4-D Radiation Memory or similar device may well become a necessary component because of its (i) large degree of parallelism, (ii) high input/output bandwidth, and (iii) high storage capacity. Using wafer-scale integration and three-dimensional packaging, these computers promise to deliver unprecedented computing power with very small cost, size and power consumption. However, using present storage technologies for secondary memory in these computers is not practical due to the overall cost, weight, power, and size of the required memory system. Fortunately, the 2-P 4-D Radiation Memory is well-suited to this type of system, and will be able to efficiently satisfy the bandwidth and capacity requirement of these future computing systems.

6. Recapitulation of the Preferred Embodiment of the Invention, and Possible Variations Thereof The present invention contemplates (i) the addressing, and (ii) the writing (or erasing) of data to, or the reading of data from, selected domains within a three-dimensional volume of radiation-sensitive medium. The "radiation-sensitive" medium is sensitive to radiation in its absorption band so as to undergo an anomalous, stable, change in its index of refraction. The (i) addressing, and the (ii) writing (erasing) and the reading, is all by and with two selectively chosen, coincident, radiation pulses. The radiation pulses are (i) selectively guided, and (ii) time sequenced, to spatial and temporal coincidence so as to cause certain selected domains, and only those certain selected domains, to interact with both pulses by process of two-photon interaction. During writing of the radiation-sensitive medium selectively undergoes selected changes by process of two-photon absorption.

The great abundance of "selections" within the preceding paragraph accord a flexibility and a discrimination in exactly what is being done, and a definition of exactly where it is so being done, within the three-dimensional volume of radiation-sensitive medium. Simplistically, those domains of a three-dimensional volume of radiation-sensitive medium that are desired to be changed will be so changed, as desired, and will remain changed until changed again, if and when desired, while all domains not specifically selected will remain unchanged. This concept is basic to all memories. However, the implementation of this concept within the volume of radiation-sensitive medium in accordance with the present invention has been seen to require a good deal of selectivity in choosing, modulating, directing and time-sequencing radiation pulses.

A flexibility and discrimination in the choice of wavelength of each of two radiation pulses permits, for example, that a three-dimensional inhomogeneity pattern may be, at times, either selectively radiatively (i) emplaced within, (ii) interrogated from, or (iii) erased from a three-dimensional volume—in-situ. The three-dimensional inhomogeneity pattern may constitute, for example, either (i) a physically tangible and persistent object, (ii) a transient display, or, preferably, (iii) a writable, readable, and erasable volume radiation memory.

Such a volume radiation memory, in particular, is characterized by a great multiplicity of selectively addressable and readable and writable domains, giving a high storage density on the order of $10^8$ bits/cm$^3$. The radiative reading and writing is very fast, giving an input/output data transfer bandwidth to and from the memory on the order of $10^{12}$–$10^{15}$ bits/second into each cm$^3$ of radiation-sensitive medium. Many problems of scale, and parallelism, that attend previous memory technologies—such as limitations arising from necessary electrical interconnections, silicon real estate, and or heat—are substantially obviated in the 2-P 4-D radiation memory of the present invention. Accordingly, the radiation memory technology in accordance with the present invention is typically cheaper and faster than competing previous technologies while scaling upwards in performance, and down in cost, gracefully. For example, one preferred memory material is an optically radiation-sensitive medium in a plastic matrix that typically costs on the order of some U.S. cents (1/100 $ U.S.) per cm$^3$.

The apparatus, and method, of the present invention employs a three-dimensional volume of radiation-sensitive medium. The medium selectively regionally undergoes selected changes in response to two-photon absorption arising from a correspondingly selected pair of spatially-intersecting temporally-coincident radiation pulses. The medium always selectively regionally interacts with the same pair of spatially-intersecting temporally-coincident radiation pulses by process of two-photon interaction. The radiation-sensitive medium may be changed by interaction with the combined pulses; each and both of the two pulses are changed by their combined interaction with the radiation-sensitive medium.

The preferred radiation-sensitive medium is a photochromic material that (i) has an index of refraction that varies greatly with the wavelength (equivalently, the frequency or the energy) of radiation with which the medium interacts, and that (ii) radiatively undergoes stable changes in its index of refraction. The preferred radiation-sensitive medium is preferably a photochromic chemical, and is more preferably spirobenzopyran. Spirobenzopyran has an index of refraction that varies with wavelength (equivalently, with frequency or with energy), being relatively much greater for relatively shorter wavelengths. Moveover, the spirobenzopyran reversibly changes between its first, spiropyran, and its second, merocyanine, stable molecular isomeric forms in response to irradiation at an appropriate energy level. Importantly to the present invention, each of these forms has a different index of refraction.

The spirobenzopyran medium is particularly induced to change from its first to its second isomeric molecular form, and from its first to its second index of refraction, by two selected coincident light beams (nominally of 532 nm and 1064 nm) that jointly sum to an ultraviolet (i.e., UV or "blue") energy level. The spirobenzopyran medium is, incidentally to the primary operation and detection of the 2-P 4-D radiation memory of the present invention, induced to fluoresce in its second isomeric molecular form (only) by two selected coincident green-red light beams (nominally 1064 nm each) that jointly sum to a visible (i.e., "white") energy level. Finally, the spirobenzopyran medium is induced to erase back to its first isomeric molecular form by two selected coincident light beams that jointly sum to an infrared (i.e., IR or "red") energy level.

Such a "red, white, and blue" radiation-sensitive medium, and its functional equivalents, is distinguished, from the perspective of the present invention, for being (i) transparent and unreactive, in each of its potentially several conditions, to any light beam or beams collectively having less than a threshold energy, (ii) substantially stable in those changed conditions that it selectively assumes under impinging light of appropriate energy magnitude, (iii) substantially transparent to radiation of a low energy, and (iv) selectively transparent to radiation of an effective higher energy—including radiation effectively of such a higher energy by a two-photon process—dependent upon the prior condition of such medium, and particularly its index of refraction. Conditions (i) and (ii) go to the radiation-sensitive medium. These two conditions effectively make that the medium is not changed save when, and where, it is desired that it should be so changed by process of two-photon absorption. This is not enough. Conditions (iii) and (iv) go to the illuminating radiation itself. These two conditions effectively make that the radiation is not substantially changed in its passage through the medium save when, and where, it is desired that it should be so changed by process of two-photon absorption.

These four characteristics are, in combination, profound. They permit that a three-dimensional volume of radiation-sensitive medium may be selectively radiatively both written and read, and that it is stable in the conditions assumed. They permit that two radiation pulses (or beams) may be passed through a volume of radiation-sensitive medium may be selectively radiatively interactive with the medium at only certain selected locations thereof.

The minimum theoretical amount, or a "domain," of such an radiation-sensitive medium that may be independently manipulated is but a single molecule. However, because a single molecule is typically much smaller than the diffraction limited spot sizes of the radiation, normally light, that is used to selectively manipulate such a molecule, the volume of a domain is typically a few cubic microns.

The granularity of a three-dimensional inhomogeneity pattern that is radiatively created within the radiation-sensitive medium, or, equivalently, the information storage density of a volume memory that is made from the medium, is limited only by the ability to reliably bring separate, intersecting, pulses of light into temporal and spatial coincidence within the minute domains of a volume of the medium. (It is not immediately apparent that the optical resolution, or discrimination, in radiatively "addressing" domains within a three-dimensional volume of radiation-sensitive medium should constitute the limiting factor to the granularity of the manipulation of such a medium. For example, it might have been difficult to put enough radiative energy into the selected domains. In fact, a simultaneous delivery of sufficient radiative energy into even a large number (e.g., $10^6$) of selected domains constitutes, with high-power laser radiation sources, no insurmountable problem. In fact, it might have proven difficult to detect the minute flux of fluorescence that arises from a reading interrogation of a spatially minute domain. In fact, it is not difficult to so detect weak, and transient, light flashes resulting from fluorescence—at least when modern semiconductor light detectors are used. Accordingly, the challenge is to radiatively locate and address cubic micron size domains. The domains respond reliably to appropriate coincident radiation beams, and hold state reliably regardless of their minute volumes.)

The size of the three-dimensional volume of radiation-sensitive medium is limited more by the cumulative effects—such as attenuation and miscellaneous diffraction, jointly amounting to noise—on the radiation beams passing therethrough than it is by any factors of ability to deliver energy into the medium, or to interact it by process of two-photon absorption at selected domains. In other words, a principle reason that the 2-D 4-P radiation memory is not $10 \times 10 \times 10$ cm$^3$—or 1000 times the capacity of the already commodious memory of nominal size one cubic centimeter—is that the radiation (light) pulses are subject to optical noise on their paths. There is a limit, even with the sharp selectivity accorded by the two-photon process to how many orders of magnitude more material a radiation pulse may travel through substantially un-reacted than is the size of one small, unique, domain with which the radiation does interact. The limitation of 1 cm$^3$ size to the volume of radiation-sensitive medium should not be though to be absolute, nor even limiting. However, optical signal to noise ratio must be regarded in the construction of ever larger 2-P 4-D radiation memories.

The signal, as well as the noise, must also be regarded. The information storage density (if not the overall size) of the radiation-sensitive medium, is limited only by the ability to reliably bring separate, intersecting, pulses of light into temporal and spatial coincidence within minute domains, and to detect interaction of these domains with the light pulses (the "signal" of the signal to noise ratio).

In accordance with the present invention the selective manipulation, or "addressing," capability of a three-dimensional volume of radiation-sensitive medium is quite good: a selected grid array of $2 \times 10^3 \times 2 \times 10^3$ domains may typically be "addressed" by intersecting light beams over a planar area of 1 cm×1 cm. Typically at least $2 \times 10^3$ such planar bit arrays, or bit planes, may be "addressed" in each 1 cm$^3$ volume. Accordingly, the total storage capacity is $2 \times 10^3$ by $2 \times 10^3$ by $2 \times 10^3$, or 8×109 total domains, or bits.

The selective radiative "addressing" of domains is only indirectly correlated with the numbers of such addressable domains that are to be simultaneously manipulated. In the present invention the manipulations of the domains is of the same scale as the addressing. The manipulation of the domains is massively parallel: an entire bit plane of $4 \times 10^6$ domains may typically be simultaneously both addressed and manipulated.

Addressing access (setup) times are typically in the order of milliseconds, and repetitive radiative reading or writing times are typically in the order of microseconds. This rapid addressing, and selective radiation manipulation, is realized by completely solid state, and non-mechanical, light steering and modulating components.

The manner of selectively addressing domains, typically an entire bit plane of such $4 \times 10^6$ such domains, within the three-dimensional volume of radiation-sensitive medium is both conceptually and operationally distinguished from the manner in which the multiplicity ($4 \times 10^6$) of domains that are simultaneously addressed are ultimately selectively radiatively manipulated. Selective addressing in accordance with the present invention is a matter of bringing two light pulses into temporal and spatial intersection at certain selected domains (the selected bit plane), and insubstantially into coincidence elsewhere (the unselected bit planes). Selective manipulation in accordance with the present invention is a matter of binary modulation of the radiative flux intensity of spatial regions upon a single wavefront of (typically) one (only) of the two light pulses.

In embodiments of the present invention the selective addressing is obtained by directing, preferably in and by a one-dimensional spatial light modulator that is electronically controlled, a first light pulse so as to progressively successively selectively illuminate, in its passage through a volume of radiation-sensitive medium, all domains lying along a one directional axis through the volume. Meanwhile and at the same time a second light beam progressively successively illuminates absolutely all domains within the entire volume during its passage along a directional axis though the volume which axis intersects the first axis, and which axis may be the first axis. By a controlled (i) direction and (ii) time sequence of two light pulses, only those domains that are within the a unique locus of intersection points will have any potential to receive substantial coincident illumination from both the first and second light beams, and to undergo change by process of two-photon absorption.

In accordance with the present invention, a spatial encoding of the regions upon a single wavefront of the one light pulse is used, in conjunction with the other light pulse, to interact with selected domains with the volume of radiation-sensitive medium by process of two-photon interaction. The spatial encoding of the one light pulse is a binary amplitude modulation. Each of the spatial regions of an n×n grid array will desirably contain either (i) full intensity light flux or (ii) no light flux at all.

Such on-off binary amplitude modulation can be roughly obtained, among other alternatives, by a spatial light modulator (SLM) of the amplitude-modulating type that directly modulates amplitude, or intensity. The binary spatial amplitude modulation of the light pulse is typically of extremely high quality: essentially each region of an n×n grid array upon a single wavefront of the light pulse will contain either (i) full, or else (ii) no, light flux.

It should be appreciated that neither intersecting light pulse in the 2-P 4-D Radiation Memory of the present invention operating by process of two-photon interaction needs to be focused so as to improve optical signal-to-noise. It should be appreciated that the 2-P 4-D Radiation Memory will certainly function if the quality of binary spatial encoding of an interrogatory radiation beam is not 100%, and some spurious light flux "leaks" through.

7. Conclusion

The 2-P 4-D Radiation Memory in accordance with the present invention stores information in a 3-D volume while permitting parallel access to an entire bit plane of information, thus increasing the memory bandwidth by orders of magnitude over present two-dimensional memory devices. In addition, because the data is stored in a volume, very high data storage capacities can be achieved within a very small and inexpensive amount of radiation-sensitive medium. The fast access time, and the low cost per megabyte, potentially makes the 2-P 4-D Radiation Memory a competitor to magnetic and/or optical disks for mass storage applications. Such a 2-P 4-D Radiation Memory may well be a critical component to the success of future parallel supercomputers, particularly those that are based on opto-electronic and 3-D VLSI technologies.

Accordingly, the scope of the present invention should be determined by the following claims only, and not solely in terms of that preferred embodiment within which the invention has been taught.

What is claimed is:

1. A radiation memory comprising:

a three-dimensional volume of a medium
that is sensitive to radiation in its absorption band so as to undergo an anomalous, stable, change in a physical property of the medium, which physical property affects the passage of radiation through the medium, from a first level to a second level,
that, regardless of a prevailing level of the physical property of the medium, has and exhibits a relatively greater impediment to a transmission of radiation of a relatively shorter wavelength, a relatively higher frequency and a relatively higher energy in a straight path through the medium, and
that, regardless of a prevailing level of the physical property of the medium, has and exhibits a relatively lesser impediment to a transmission radiation of a relatively longer wavelength, a relatively lower frequency and a relatively lower energy in a straight path through the medium; and radiation-directing means for directing two radiation pulses,
each of which has an individual wavelength sufficiently long, a frequency sufficiently low and an energy sufficiently low so as to be non-interactive with the medium to cause (i) any change in the physical property of the medium, or (ii) any change in a straight-line propagation, which straight-line propagation through the medium is unaffected regardless of what level of its physical property the medium exhibits along the path or portions thereof,
to temporal and spatial intersection within the volume of the medium so that, by satisfaction of the quantum mechanical equations of two-photon interaction, (i) a portion of the volume of the medium at a locus of intersection interacts with each and with both of the radiation pulses by process of two-photon interaction, while (ii) portions of the volume of medium outside this locus are non-reactive with either radiation pulse; and radiation-timing means for controlling the temporal phase of one of the two directed radiation pulses relative to the other of the two directed radiation pulses in order to select the volume portion of their intersection whereat occurs the two-photon interaction.

2. The radiation memory according to claim 1 wherein the three-dimensional volume of the medium
is sensitive to radiation in its absorption band so as to undergo an anomalous, stable, change in its index of refraction, and
has and exhibits a relatively greater index of refraction to radiation of a relatively shorter wavelength, higher frequency and higher energy, and a relatively lower index of refraction to radiation of a relatively longer wavelength, lower frequency and lower energy; and
wherein the means for directing two radiation pulses is so directing two radiation pulses each of which has an individual wavelength, frequency and energy that is both (i) non-interactive with the medium to cause the anomalous, stable, change in its index of refraction, and (ii) that is un-refracted in passage in a path through the medium regardless of what indices of refraction the medium exhibits along the path or portions thereof.

3. The radiation memory according to claim 2
wherein the means for directing two radiation pulses is so directing two radiation pulse to temporal and spatial intersection within the volume of the medium so that, by satisfaction of the quantum mechanical equations of two-photon absorption, a portion of the volume of the medium at a locus of intersection interacts with each and with both of the radiation pulses by process of two-photon absorption so as to effectuate the anomalous, stable, change in the index of refraction of the medium at this portion of the volume, while portions of the volume of medium outside this locus are non-reactive with either radiation pulse to effectuate any change whatsoever in the pre-existing index or indices of refraction of these portions.

4. The radiation memory according to claim 2
wherein the means for directing two radiation pulses is so directing two radiation pulse to temporal and spatial intersection within the volume of the medium so that, by satisfaction of the quantum mechanical equations of two-photon interaction, a portion of the volume of the medium at a locus of intersection interacts with each and with both of the radiation pulses by process of two-photon interaction so as to effectuate an impediment to the further straight-line transmission of each and of both pulses selectively dependent upon the pre-existing index of refraction at this volume portion, while other portions of the volume of medium outside this locus are non-reactive with either radiation pulse to impede the straight-line transmission of either pulse regardless of the pre-existing index or indices of refraction of these portions.

5. The radiation memory according to claim 4 further comprising:
at least one detector means for detecting a one of the radiation pulses after its passage through the medium, and after its intersection of and interaction with the other radiation pulse within the volume portion of the medium.

6. The radiation memory according to claim 5 further comprising
means for controlling the directions of the two directed radiation pulses relative to each other.

7. The radiation memory according to claim 6
wherein the means for controlling the directions of the two directed radiation pulses relative to each other is so controlling the pulses to intersect at 180°, and to be counter-propagating, relative to one another.

8. The radiation memory according to claim 6
wherein the means for controlling the directions of the two directed radiation pulses relative to each other is so controlling the pulses to intersect at 90°, and to be perpendicular, relative to one another.

9. The radiation memory according to claim 1 further comprising:
   means for controlling the directions of the two directed radiation pulses relative to each other in order to select the volume portion of their intersection.

10. The radiation memory according to claim 9
   wherein the means for controlling the directions of the two directed radiation pulses relative to each other so as to cause the pulses to intersect at 180°, and to be counter-propagating relative to one another.

11. A method of reacting radiation at and only at, with an only with, a selected portion of a three-dimensional volume of radiation-sensitive medium while unselected volume portions are un-reacted with the radiation to change either (i) these volume portions or (ii) the radiation, the method comprising:
   illuminating a three-dimensional volume of a medium
      that is sensitive to radiation in its absorption band so as to undergo an anomalous, stable, change in a physical property of the medium, which physical property affects the passage of radiation through the medium, between a first and a second level,
      that, regardless of whether the physical property is at the first or the second level, has and exhibits a relatively greater impediment to a transmission of radiation of a relatively shorter wavelength, a relatively higher frequency and a relatively higher energy in a straight path through the medium, and
      that, regardless of whether the physical property is at the first or the second level, has and exhibits a relatively lesser impediment to a transmission radiation of a relatively longer wavelength, a relatively lower frequency and a relatively lower energy in a straight path through the medium,
   with two radiation pulses,
      each of which is of a selectively predetermined time duration, and phase relative to the other, while
      each of which has an individual wavelength, frequency and energy that is both (i) non-interactive with the medium to cause the anomalous, stable, change in the level of its physical property, and (ii) that is unaffected in passage along a path through the medium regardless of what level of its physical property the medium exhibits along the path or portions thereof,
   so that a temporal and spatial intersection within the volume of the medium satisfies the quantum mechanical equations of two-photon interaction to cause a portion of the volume of the medium as is defined by the time durations and the relative phase of the two radiation pulses at a locus of intersection to interact with each and with both of the radiation pulses by process of two-photon interaction, while portions of the volume of medium outside this locus are non-reactive with either and with both radiation pulses, and
   so that each radiation pulse is itself un-reacted with all portions of the volume of the medium, passing straight through these portions regardless of the level of the physical property of these portions of the volume of the medium, save only that each and both radiation pulses are reacted with the portion of the volume of the medium at the locus of intersection, and at this portion each and both of the radiation pulses interacts with the physical property of the volume of the medium at this portion by process of two-photon interaction so as to be selectively relatively more greatly, or relatively less greatly, impeded in further transmission dependent upon whether the physical property of the medium is at its first, or at its second, level.

12. A radiation memory comprising:
   a source of at least two time-resolved wave fronts of radiation, an energy of either of which radiation wave fronts is below a threshold energy level but the sum energy of both which radiation wave fronts equals the threshold energy level;
   a three-dimensional volume of a radiation-sensitive medium having at least two stable states each of which stable states has an associated index of diffraction different from the index of diffraction of the other state, and one of which states is responsive to radiation of the threshold energy level to change to the other state while being (i) transparent, and (ii) insensitive to change state, to radiation of energy below this threshold energy level;
   a radiation wave front data modulating means, receiving a one radiation wave front from the source, for two-dimensionally spatially manipulating the received radiation wave front so that it becomes two-dimensionally regionally encoded with information;
   a radiation wave front variable time delay means, receiving a one radiation wave front from the source, for variably delaying the received radiation wave front in time; and
   a radiation directing means for directing at least two radiation wave fronts from the source, at least one of which radiation wave fronts is two-dimensionally regionally-encoded by the modulating means and at least one of which radiation wave fronts is variably time-delayed by the delay means, into a spatial and temporal intersection within the three-dimensional volume of radiation-sensitive medium so that
      a set of domains that are within the three-dimensional volume of radiation-sensitive medium are defined by the spatial and temporal coincidence of the at least two intersecting radiation wave fronts,
      the defined set of domains is unique, and non-inclusive, of any corresponding set of domains that are likewise defined in the three-dimensional volume upon any alternative time delay of a radiation wave front by the delay means, and
      each of the domains that is within the defined unique set receives sufficient and sufficiently long radiation from the at least two intersecting radiation wave fronts so as to interact therewith to selectively change states, and state-associated index of refraction, by process of two-photon absorption, while
      each and all the domains that are not within the defined unique set do not interact with either of the wave fronts of radiation.

13. The radiation memory according to claim 12 in operational use for writing information into the defined unique subset of domains
   wherein the at least two wave fronts of radiation from the radiation source are each below a first threshold energy level, but wherein the sum energy of both radiation wave fronts equals the first threshold energy level;
   wherein the three-dimensional volume of radiation-sensitive medium is responsive to radiation of the first threshold energy level to change from a first state to the a second state, while being (i) transparent, and (ii) insensitive to change states, to radiation below this first threshold energy level; and wherein the radiation directing means is directing the at least two radiation wave fronts from the source, at least one of which radiation wave fronts is two-dimensionally regionally-encoded by the modulating means and at least one of which radiation wave fronts is variably time-delayed by the delay means, into a spatial and temporal intersection within the three-dimensional volume of radiation-sensitive medium so that the unique defined set of domains selectively interacts with the radiation wave fronts so as to change from the first to the second state by process of two-photon absorption, while each and all the domains that are not within the defined unique set do not interact with either of the plane waves of radiation.

14. The radiation memory according to claim 12 wherein the radiation wave front data modulating means comprises:
   a page composer for generating a two dimensional array of regions variably individually selectively controllable so as to selectively two-dimensionally mask the received radiation wave front so that it becomes two-dimensionally regionally encoded with information.

15. A method of radiatively addressably defining, and selectively uniquely addressing for purposes of selective manipulation, multiple pluralities of domains each within a uniquely associated portion of a homogeneous three-dimensional volume of radiation-sensitive medium, the method of radiatively defining plural domains within a homogeneous volume comprising:
   time resolving radiation into two, a first and a second, spatially-two-dimensionally-extended pulse wave fronts
      each of which two wave fronts has a plurality of arrayed regions in its two-dimensional spatial extension, and
      which two wave fronts are jointly sufficiently short so that, should they be directed to intersect, then their region of intersection will, by the quantum mechanical equations of two-photon absorption in the radiation-sensitive medium of the three-dimensional volume, be compact in at least one spatial dimension to a distance of less than x;
   directing the two pulse wave fronts into spatial and temporal intersection within a homogeneous volume of radiation-sensitive medium that has at least one spatial dimension greater than x so as to define therein an intersection region having at least one dimension less than x, which intersection region contains (i) less than the totality of the volume, and (ii) plurality of three-dimensional sub-regions, called domains, defined and located where the plurality of regions that are two-dimensionally spatially arrayed upon the first wave front spatially and temporally intersect a corresponding plurality of regions that are two-dimensionally spatially arrayed upon the second wave front so as to satisfy thereat the quantum mechanical equations of two-photon absorption in the radiation-sensitive medium of the three-dimensional volume;
   wherein plural domains have been radiatively defined within a homogeneous volume of radiation-sensitive medium containing a multiplicity of such domains.

16. A method of radiatively selectively manipulating a selectively unique, two-dimensional, plurality of domains within a three-dimensional volume of radiation-sensitive medium containing a three-dimensionally arrayed multiplicity of such domains, the method of radiatively manipulating selected plural domains within a volume comprising:
   radiatively illuminating a volume of radiation-sensitive medium, the medium sensitive to radiation of a threshold energy to undergo change, with a first spatially-two-dimensionally-extended first radiation wave front having a first energy less than the threshold energy;
   radiatively illuminating the volume with a second spatially-two-dimensionally-extended second radiation wave front having a second energy, also less than the threshold energy, so that the first and the second radiation wave fronts spatially and temporally intersect within the volume;
   wherein each of the first and the second radiation wave fronts has a corresponding plurality of arrayed regions in its two-dimensional spatial extension;
   wherein the combined first energy of the first radiation wave front and the second energy of the second radiation wave front is equal of greater than the threshold energy;
   wherein the first and the second wave fronts are jointly sufficiently short so that their region of intersection is, by the quantum mechanical equations of two-photon absorption in the radiation-sensitive medium of the three-dimensional volume, compact to cause the change in only a an intersection region containing (i) less than the totality of the volume, and (ii) a plurality of three-dimensional sub-regions, called domains, defined and located where the plurality of regions that are two-dimensionally spatially arrayed upon the first wave front spatially and temporally intersect a corresponding plurality of regions that are two-dimensionally spatially arrayed upon the second wave front so as to satisfy thereat the quantum mechanical equations of two-photon absorption in the radiation-sensitive medium;
   wherein plural domains have been radiatively manipulated within a homogeneous volume of radiation-sensitive medium as a function of the distance over which two intersecting two-dimensionally-spatially-extended wave fronts of radiation interact by process of two-photon absorption within the volume.

17. A method of producing a localized inhomogeneity pattern in a volume of radiation-sensitive medium in response to directed radiation, the method comprising:
   time-resolving two spatially-two-dimensionally-extended radiation beams into a corresponding two pulse wave fronts jointly sufficiently short so that any spatial and temporal region of intersection of the two wavefronts will, by the quantum mechanical equations of two-photon absorption, be compact in at least one spatial dimension to a distance of less than x;
   directing the two pulse wave fronts into spatial and temporal intersection within a volume of radiation-sensitive medium
      that has at least one spatial dimension greater than x,
      that has at least two states each of which has an associated index of diffraction different from the index of diffraction of the other state, and
      that is responsive to radiation to change from one of its states to the other,
      in order to change a selected portion of the volume of radiation-sensitive medium, less than the entirety thereof, from a one state having an associated index of refraction to a different state having a different associated index of refraction by process of plural-photon absorption.

18. The method according to claim 17 including:
   containing the radiation-sensitive medium in a matrix of a material transparent to the beams of radiation and capable of maintaining a stable shape.

19. The method according to claim 17 wherein the radiation-sensitive medium changes from its first to its second state in response to radiation having an energy equal to or greater than a first threshold energy, the method further comprising:

first radiating the volume of radiation-sensitive medium with a first pulse wave front of radiation having a first energy that is less than the first threshold energy; and simultaneously second radiating the volume of radiation-sensitive medium with a second pulse wave front of radiation having a second energy that is also less than the first threshold energy;

wherein the combined energies of the first and second directed radiation pulse wave fronts of the first and the second radiating are at least equal to the first threshold energy, and thus suffice to change the selected portion of the radiation-sensitive medium from a first state having an associated first index of refraction to a second state having an associated second index of refraction by process of two-photon absorption.

20. The method according to claim 17 wherein the radiation-sensitive medium changes from its second state having the associated second index of refraction to its first state having the associated first index of refraction in response to radiation having at least a second threshold energy less than the first threshold energy, the method further comprising:

third radiating the selected portion of the radiation-sensitive medium with a third pulse wave front of radiation having a third energy that is less than the second threshold energy; and simultaneously fourth radiating the selected portions of the radiation-sensitive medium with a fourth pulse wave front of radiation having a fourth energy that is also less than the second threshold energy;

wherein the combined energies of the third and fourth pulse wave fronts of the third and the fourth radiating are least equal to the second threshold energy, while being less than the first threshold energy, so as to cause by process of two-photon absorption the selected portion of the radiation-sensitive medium to change from its second state having the associated second index of refraction to its first state having the associated first index of refraction.

21. The method according to claim 19 further comprising at a time after the directing:

elevating the temperature of the radiation-sensitive medium to change at least the selected portion thereof from the second state to the first state.

* * * * *